(12) United States Patent
Liaw

(10) Patent No.: US 9,564,211 B2
(45) Date of Patent: Feb. 7, 2017

(54) MEMORY CHIP AND LAYOUT DESIGN FOR MANUFACTURING SAME

(71) Applicant: TAIWAN SEMICONDUCTOR MANUFACTURING COMPANY, LTD., Hsinchu (TW)

(72) Inventor: Jhon Jhy Liaw, Zhudong Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/317,146

(22) Filed: Jun. 27, 2014

(65) Prior Publication Data

US 2015/0380078 A1    Dec. 31, 2015

(51) Int. Cl.
G11C 11/00       (2006.01)
G11C 11/419      (2006.01)

(52) U.S. Cl.
CPC ................... G11C 11/419 (2013.01)

(58) Field of Classification Search
CPC .................................. G11C 11/419
USPC ......... 365/156, 154, 63, 51, 189.08
See application file for complete search history.

(56) References Cited

U.S. PATENT DOCUMENTS

| | | | | |
|---|---|---|---|---|
| 6,731,534 B1* | 5/2004 | Fan | ............... | G11C 7/12 365/154 |
| 7,215,587 B2* | 5/2007 | Lee | ............... | G11C 7/14 365/190 |
| 8,315,085 B1* | 11/2012 | Chang | ............... | 365/154 |
| 8,467,257 B1* | 6/2013 | Liu | ............... | G11C 7/065 365/154 |
| 8,570,789 B2* | 10/2013 | Chang | ............... | G11C 11/413 365/138 |
| 8,929,160 B2* | 1/2015 | Katoch | ............... | G11C 7/227 365/154 |
| 8,964,492 B2* | 2/2015 | Hsu | ............... | G11C 11/419 365/191 |
| 9,001,613 B2* | 4/2015 | Wang | ............... | G11C 7/18 365/191 |
| 9,105,328 B2* | 8/2015 | Chiu | ............... | G11C 7/227 |
| 9,117,506 B2* | 8/2015 | Hsu | ............... | G11C 5/145 |
| 2011/0249524 A1* | 10/2011 | Wang | ............... | G11C 7/08 365/205 |
| 2012/0195106 A1* | 8/2012 | Wang | ............... | G11C 11/418 365/154 |
| 2014/0010032 A1* | 1/2014 | Seshadri | ............... | G11C 7/12 365/203 |

\* cited by examiner

*Primary Examiner* — Viet Q Nguyen
(74) *Attorney, Agent, or Firm* — Hauptman Ham, LLP

(57) ABSTRACT

A static random access memory (SRAM) chip including a plurality of SRAM cells and a plurality of cell current tracking cells. Each of the SRAM cells include a source voltage reference conductor, a first ground reference conductor, two cross-coupled inverters, and two pass-gate devices. Each cell current tracking cell include a first half-cell and a second half-cell. The first half-cell is different from the second half-cell.

20 Claims, 26 Drawing Sheets

MEMORY CHIP AND LAYOUT DESIGN FOR MANUFACTURING SAME

BACKGROUND

The semiconductor integrated circuit (IC) industry has produced a wide variety of digital devices to address issues in a number of different areas. Some of these digital devices are electrically coupled to static random access memory (SRAM) devices for the storage of digital data. As ICs have become smaller and more complex, the effects of cross-talk and wiring resistance further affect IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1A, 1B:
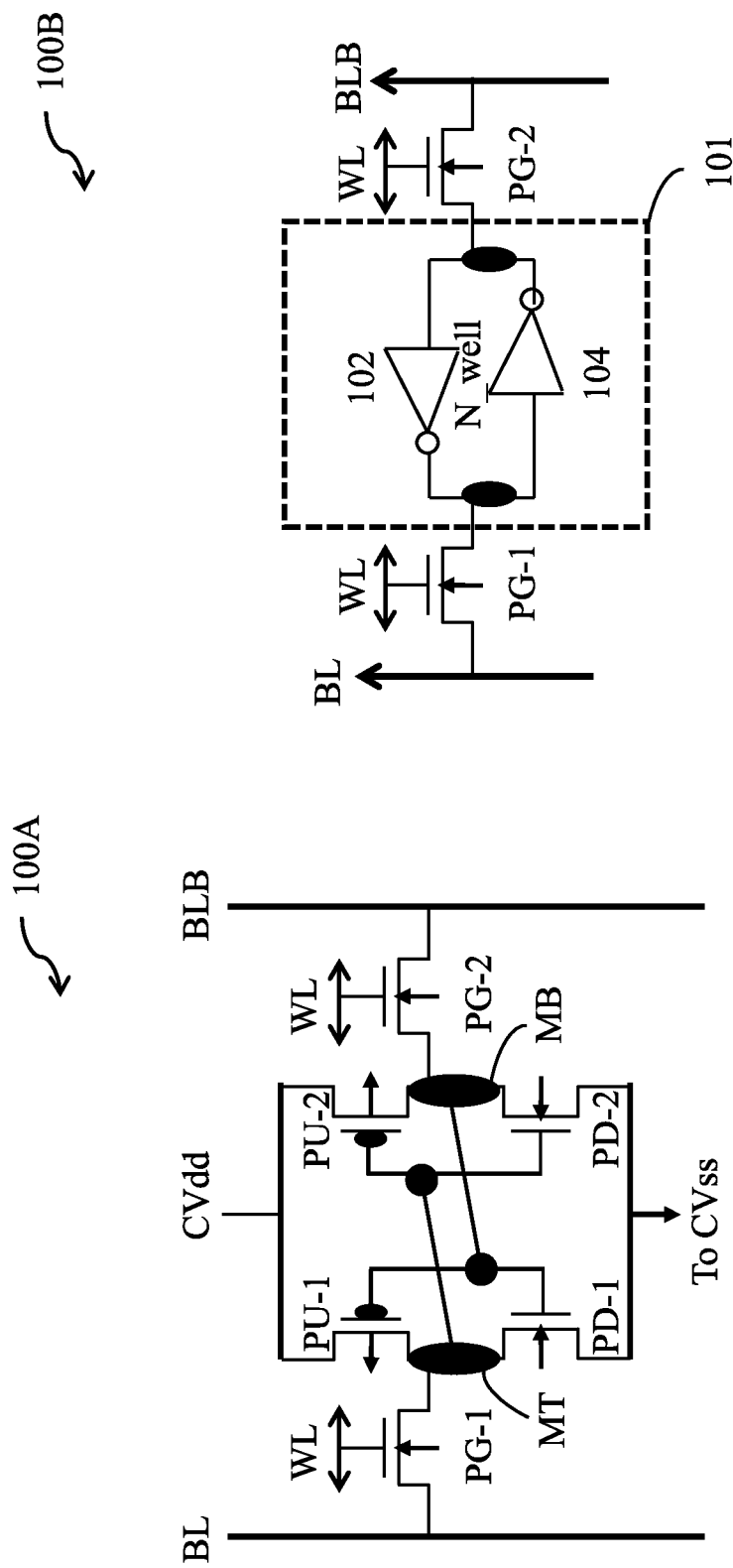
FIG. 1A is a schematic diagram of a memory cell in accordance with one or more embodiments.
FIG. 1B is a schematic diagram of a memory cell in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic diagram of a memory cell 100A in accordance with one or more embodiments. In some embodiments, memory cell 100A is a portion of one or more single port (SP) static random access memory (SRAM) cells. In some embodiments, memory cell 100A is a portion of an embedded SRAM memory cell array. In some embodiments, write ports or read ports are a part of memory cell 100A. In some embodiments, additional write ports and/or read ports are a part of memory cell 100A. In some embodiments, memory cell 100A employs a number of transistors other than six. In some embodiments, memory cell 100A is usable in a memory cell array. The schematic diagram of memory cell 100A is a basis to be modified to form other structures, such as those described herein, e.g., FIGS. 1B-1D, 2-13D.

Memory cell 100A includes cross-coupled inverter 102 (shown in FIG. 1B) connected to n-type metal oxide semiconductor (NMOS) transistor PG-1 and cross-coupled inverter 104 (shown in FIG. 1B) connected to NMOS transistor PG-2. In some embodiments, cross-coupled inverters 102 and 104 form a storage unit. In some embodiments, memory cell 100A includes three-dimensional gate structures, e.g., fin field-effect-transistors (FinFET). In some embodiments, memory cell 100A is a portion of a 3-Dimensional (3D) structure enabling ultra-high density integration at the individual transistor-level. In a 3D IC, each of the device layers is fabricated sequentially and is stacked upon the preceding layer.

The cross-coupled inverter 102 includes p-type metal oxide semiconductor (PMOS) transistor PU-1 and NMOS transistor PD-1. The cross-coupled inverter 104 includes PMOS transistor PU-2 and NMOS transistor PD-2.

The source terminal of each PMOS transistor PU-1, PU-2 is electrically connected to a power supply voltage (CVDD) terminal. The drain terminal of each PMOS transistor PU-1, PU-2 is separately electrically connected to the drain terminal of each NMOS transistor PD-1, PD-2 at corresponding nodes MT and MB. A gate terminal of PMOS transistor PU-1 is electrically connected to a gate terminal of NMOS transistor PD-1 and the drain terminal of NMOS transistor PD-2. Similarly, a gate terminal of PMOS transistor PU-2 is electrically connected to a gate terminal of NMOS transistor PD-2 and the drain terminal of NMOS transistor PD-1. The source terminal of NMOS transistors PD-1 and PD-2 is electrically connected to a ground reference node CVSS. In some embodiments, ground reference node CVSS corresponds to a ground voltage.

In some embodiments, PMOS transistors PU-1 and PU-2 are referred to as pull-up (PU) devices. In some embodiments, NMOS transistors PD-1 and PD-2 are referred to as pull-down (PD) devices. In some embodiments, NMOS transistors PG-1 and PG-2 are referred to as pass-gate (PG) devices.

NMOS transistor PG-1 is configured to selectively connect cross-coupled inverters 102 and 104 to a first bit line BL. In some embodiments, NMOS transistor PG-1 is connected between first bit line BL and reference node MT. The gate of NMOS transistor PG-1 is connected to the first word line WL. Both NMOS transistor PG-1 and NMOS transistor PG-2 are configured to be activated based on a signal supplied by a word line WL.

NMOS transistor PG-2 is configured to selectively connect cross-coupled inverters 102 and 104 to a first bit line bar BLB. In some embodiments, NMOS transistor PG-2 is connected between first bit line bar BLB and reference node MB. The gate of NMOS transistor PG-2 is connected to the word line WL. Note that the term "bar" as used in this context indicates a logically inverted signal.

In some embodiments, memory cell 100A is a fully-single fin cell (e.g., each of NMOS transistors PD-1, PD-2, PG-1 and PG-2, and PMOS transistors PU-1 and PU-2 are fully-single fin transistor devices). In some embodiments, memory cell 100A is a multiple-fin cell (e.g., each of NMOS transistors PD-1, PD-2, PG-1 and PG-2 are multiple-fin transistor devices). In some embodiments, a multiple-fin transistor device is a transistor device which includes more than one fin device.

In some embodiments, in a high-density memory cell, each of the transistor devices in memory cell 100A are fully-single fin cells. In some embodiments, in a high-density memory cell one or more write assist circuits are utilized to improve the Vcc_min of each transistor in the memory cell.

In some embodiments, in a high-stability memory cell, each of the NMOS transistors PD-1, PD-2, PG-1 and PG-2 in memory cell 100A are multiple-single fin cells and the PMOS transistors PU-1 and PU-2 are single fin cells. In some embodiments, in a high-stability memory cell no write assist circuitry is utilized to improve the Vcc_min of each transistor in the memory cell.

In some embodiments, memory cell 100A is a portion of a single SRAM memory chip. In some embodiments, one or more single fin type cells and one or more multiple-fin type cells are formed in a single SRAM memory chip. In some embodiments, a single SRAM chip includes an embedded SRAM memory cell array. In some embodiments, a single SRAM memory chip includes an embedded SRAM memory cell array and a write assist circuit, where at least a portion of the embedded SRAM memory cell array is electrically connected to the write assist circuit.

FIG. 1B is a schematic diagram of a memory cell 100B in accordance with one or more embodiments. Memory cell 100B is an embodiment of the memory cell 100A (shown in FIG. 1A) with similar elements. As shown in FIG. 1B, similar elements have a same reference number as shown in FIG. 1A. In comparison with memory cell 100A (shown in FIG. 1A), memory cell 100B includes cross-coupled inverters 102 and 104. Memory cell 100B is an equivalent circuit for memory cell 100A. Cross-coupled inverter 102 is an equivalent circuit for PMOS transistor PU-1 and NMOS transistor PD-1. Cross-coupled inverter 104 is an equivalent circuit for PMOS transistor PU-2 and NMOS transistor PD-2. CMOS 101 comprises cross-coupled inverters 102 and 104.

Figures 1C, 1D:
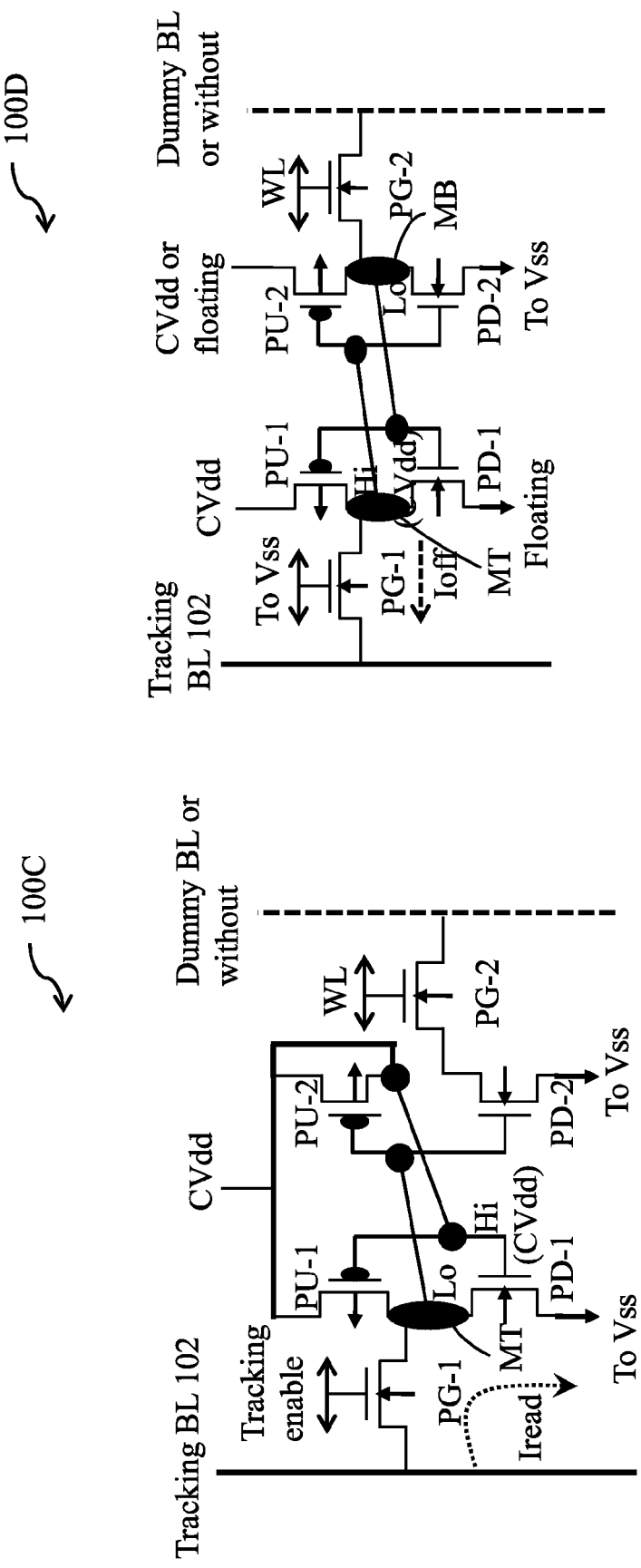
FIG. 1C is a schematic diagram of a memory cell in accordance with one or more embodiments.
FIG. 1D is a schematic diagram of a memory cell in accordance with one or more embodiments.

FIG. 1C is a schematic diagram of a memory cell 100C in accordance with one or more embodiments. Memory cell 100C is an embodiment of the memory cell 100A (shown in FIG. 1A) with similar elements. As shown in FIG. 1C, similar elements have a same reference number as shown in FIG. 1A. In some embodiments, memory cell 100C is an SRAM current tracking cell. In comparison with memory cell 100A (shown in FIG. 1A), the drain of the PMOS transistor PU-2 and the drain of the NMOS transistor PD-2 of memory cell 100C are electrically isolated from each other.

In comparison with memory cell 100A (shown in FIG. 1A), the bit line BL of memory cell 100A is replaced with a tracking bit line 102 of memory cell 100C. In some embodiments, a dummy bit line of memory cell 100C shown in FIG. 1C replaces the bit line bar BLB of memory cell 100A. A dummy bit line is a bit line that does not carry a bit line signal. In some embodiments, a floating node of memory cell 100C shown in FIG. 1C replaces the bit line bar BLB of memory cell 100A.

The drain of the PMOS transistor PU-2 is electrically connected to both the source of the PMOS transistor PU-2 and the power supply voltage (CVDD) terminal. The gate of PMOS transistor PU-1 and the gate of NMOS transistor PD-1 are both electrically connected to the power supply voltage (CVDD) terminal. The gate of NMOS transistor PG-1 is electrically connected to a tracking enable conductor. The gate of NMOS transistor PG-2 is electrically connected to the word line.

FIG. 1D is a schematic diagram of a memory cell 100D in accordance with one or more embodiments. Memory cell 100D is an embodiment of the memory cell 100A (shown in FIG. 1A) with similar elements. As shown in FIG. 1D, similar elements have a same reference number as shown in FIG. 1A. In some embodiments, memory cell 100D is an SRAM bit line capacitance tracking cell. In comparison with memory cell 100A (shown in FIG. 1A), the drain of the NMOS transistor PD-1 of memory cell 100D is electrically floating.

In comparison with memory cell 100A (shown in FIG. 1A), the bit line BL of memory cell 100A is replaced with a tracking bit line 102 of memory cell 100D. In some embodiments, a dummy bit line of memory cell 100D shown in FIG. 1D replaces the bit line bar BLB of memory cell 100A. In some embodiments, a floating node of memory cell 100D shown in FIG. 1D replaces the bit line bar BLB of memory cell 100A.

The gate of NMOS transistor PG-1 is electrically connected to the ground reference node Vss. The gate of NMOS transistor PG-2 is electrically connected to the word line. In some embodiments, the drain of the PMOS transistor PU-2 is electrically connected to the power supply voltage (CVDD) terminal. In some embodiments, the drain of the PMOS transistor PU-2 is electrically floating. In some embodiments, the floating source node of NMOS transistor PD-1 forces the data node latch MT to a logically high voltage, when the pass-gate leakage current Ioff is leaked to the tracking bit line 102.

Figure 2:
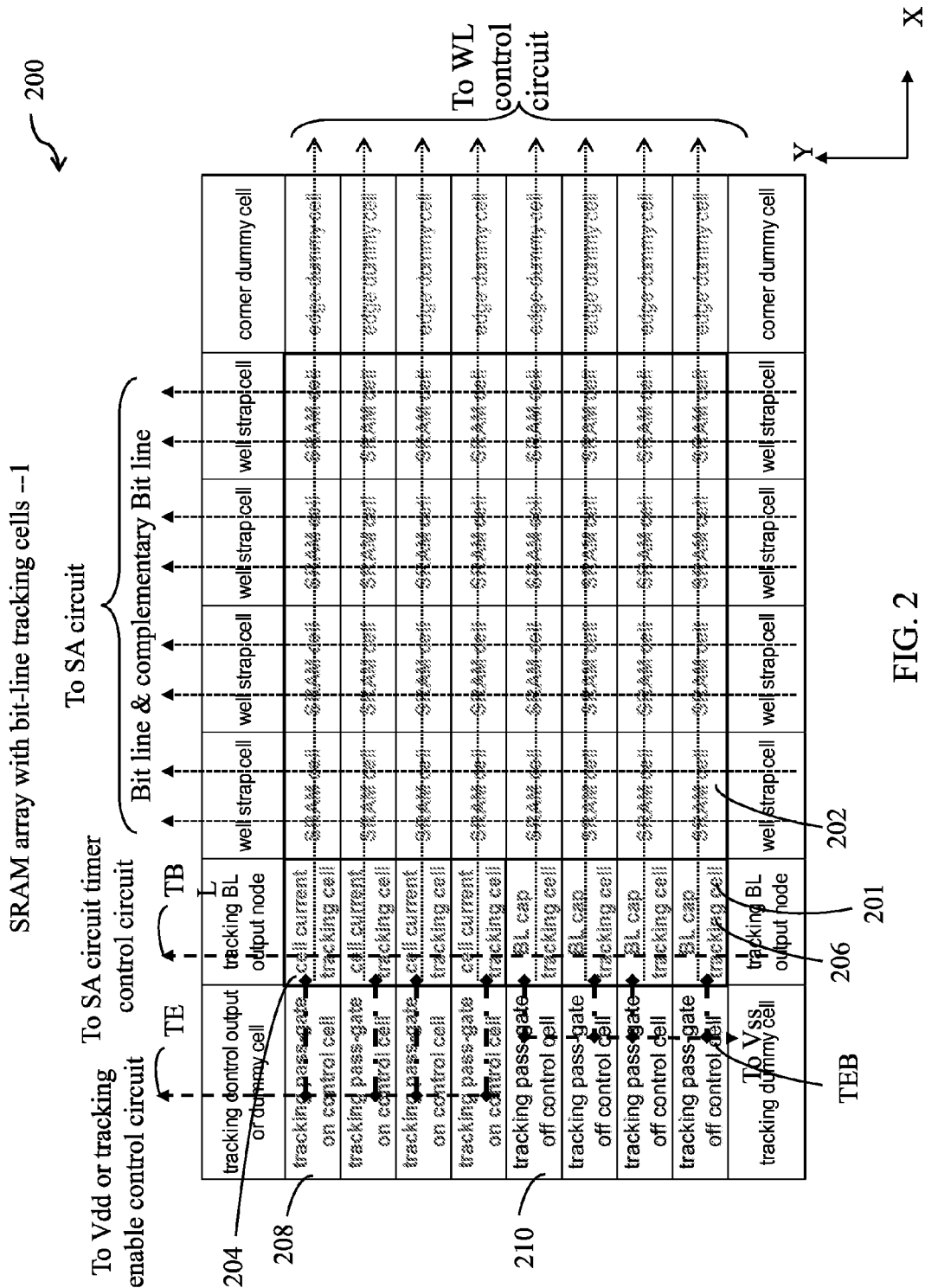
FIG. 2 is a block diagram of a memory cell array in accordance with one or more embodiments.

FIG. 2 is a block diagram of a memory cell array 200 in accordance with one or more embodiments. Memory cell array 200 comprises SRAM cells 202, tracking cells 201, tracking pass gate control cell 208, tracking pass gate control cell 210, tracking bit line TBL, tracking enable line TE and tracking disable line TEB. SRAM cells 202 are an embodiment of memory cell 100A shown in FIG. 1A. Current tracking cells 204 are an embodiment of memory cell 100B shown in FIG. 1B. Bit line capacitance tracking cells 206 are an embodiment of memory cell 100C shown in FIG. 1C. The components of the block diagram of memory cell array 200 shown in FIG. 2 are the same or are similar to those depicted in FIGS. 1A-1C with the same reference number, and the detailed description thereof is omitted.

SRAM cells 202 comprises an array of SRAM memory cells including M rows by N columns, where M is an integer corresponding to the number of rows and N is an integer corresponding to the number of columns. In some embodiments, M is an integer ranging from 4 to 512. In some embodiments, N is an integer ranging from 4 to 512.

Tracking cells 201 are arranged in a column of the memory cell array 200. In some embodiments, the tracking cells 201 are located adjacent to an edge column of the SRAM cells 202. In some embodiments, the number of tracking cells 201 ranges from 1 to 512.

Tracking cells 201 comprises one or more current tracking cells 204. In some embodiments, the number of current tracking cells 204 ranges from 1 to 512. Current tracking cells 204 are arranged in a column of the memory cell array 200. In some embodiments, each of the tracking cells 201 includes a corresponding current tracking cell 204.

In some embodiments, tracking cells 201 further comprises one or more bit line capacitance tracking cells 206. In some embodiments, memory cell array 200 does not include bit line capacitance tracking cells 206. In some embodiments, the number of bit line capacitance tracking cells 206 ranges from 0 to 511. Bit line capacitance tracking cells 206 are arranged in a column of the memory cell array 200.

Tracking pass gate control cell 208 is arranged in a column of the memory cell array 200. Each of the tracking pass gate control cells 208 is associated with a corresponding current tracking cell 204.

Tracking pass gate control cell 210 is arranged in a column of the memory cell array 200. Each of the tracking pass gate control cells 210 is associated with a corresponding bit line capacitance tracking cell 206. In some embodiments, the tracking pass gate control cells 208 share a same column as the tracking pass gate control cells 210.

Tracking bit line TBL is electrically connected to the tracking cells 201 and the sense amplifier control circuitry (not shown). In some embodiments, the tracking bit line TBL is a metal conductive layer located above the current cells 201. The tracking bit line TBL in memory cell array 200 extends in a positive y-direction.

In some embodiments, the tracking enable line TE is electrically connected to each of the current tracking cells 204 and the tracking enable control circuit (not shown). In some embodiments, the tracking enable line TE is electrically connected to the tracking pass gate control cells 208. In some embodiments, the tracking enable line TE is electrically connected to each of the current tracking cells 204 and the power supply voltage (VDD) terminal (not shown). In some embodiments, the tracking enable line TE is a metal conductive layer located above the tracking pass gate control cells 208.

Tracking disable line TEB is electrically connected to each of the bit line capacitance tracking cells 206 and the ground reference node Vss (not shown). In some embodiments, the tracking disable line TEB is electrically connected to the tracking pass gate control cells 210.

In some embodiments, the tracking disable line TEB is a metal conductive layer located above the tracking pass gate control cells 210.

Figure 3:
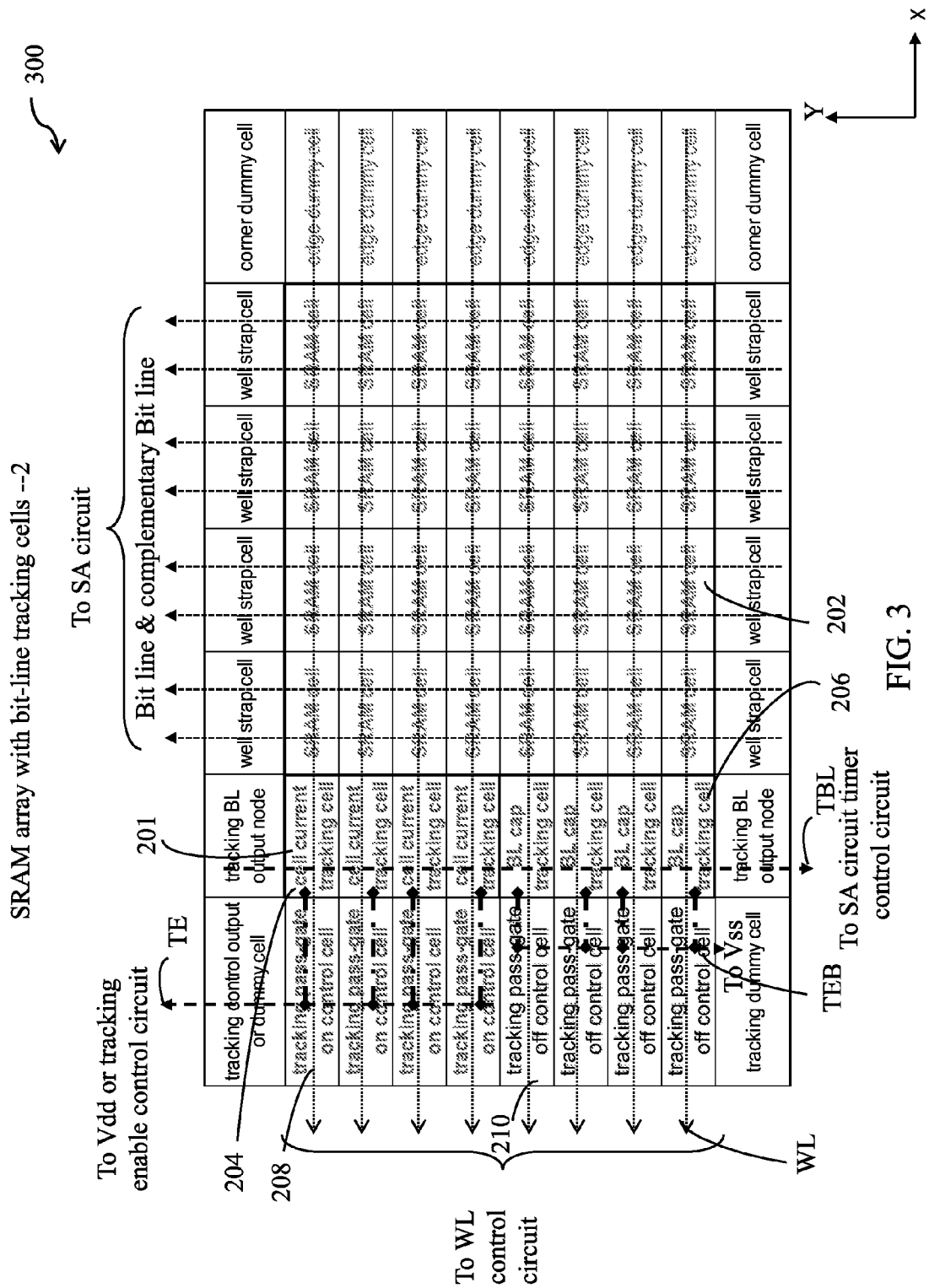
FIG. 3 is a block diagram of a memory cell array in accordance with one or more embodiments.

FIG. 3 is a block diagram of a memory cell array 300 in accordance with one or more embodiments. Memory cell array 300 is an embodiment of memory cell array 200 (shown in FIG. 2) with similar elements. As shown in FIG. 3, similar elements have a same reference number as shown in FIG. 2. In comparison with memory cell array 200 (shown in FIG. 2), the word lines WL in memory cell array 300 extend towards the tracking cells 201 (e.g., in a negative x-direction).

In comparison with memory cell array 200 (shown in FIG. 2), the tracking bit line TBL in memory cell array 300 extends in a negative y-direction.

Figure 4:
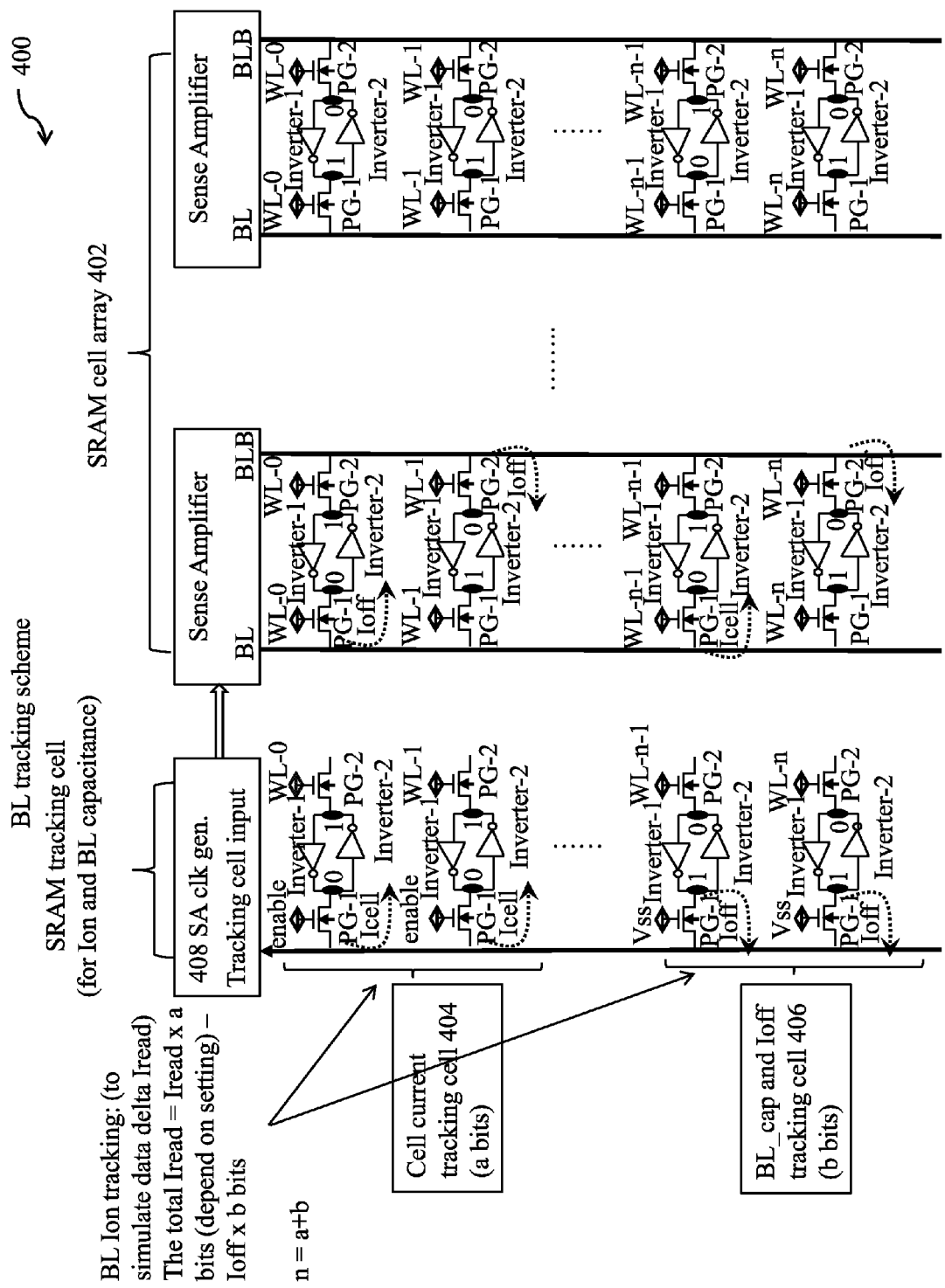
FIG. 4 is a block diagram of a memory circuit in accordance with one or more embodiments.

FIG. 4 is a block diagram of a memory circuit 400 in accordance with one or more embodiments. The components of the memory circuit 400 shown in FIG. 4 are the same or are similar to those depicted in FIGS. 1A-1B, FIG. 2 and FIG. 3 with the same reference number, and the detailed description thereof is omitted. The block diagram of memory circuit 400 is a basis to be modified to form other structures, such as those described herein, e.g., FIGS. 1A-1D, 2-13D.

Memory circuit 400 comprises SRAM memory cell array 402, current tracking cells 404, capacitance tracking cells 406 and sense amplifier clock generator 408.

SRAM memory cell array 402 is an embodiment of memory cell array 200 (shown in FIG. 2) with similar elements. As shown in FIG. 4, similar elements have a same reference number as shown in FIG. 2. SRAM memory cell array 402 is an embodiment of memory cell array 300 (shown in FIG. 3) with similar elements. As shown in FIG. 4, similar elements have a same reference number as shown in FIG. 3.

Current tracking cells 404 is an embodiment of current tracking cells 204 (shown in FIG. 2) with similar elements. As shown in FIG. 4, similar elements have a same reference number as shown in FIG. 2.

Capacitance tracking cells 406 is an embodiment of capacitance tracking cells 206 (shown in FIG. 2) with similar elements. As shown in FIG. 4, similar elements have a same reference number as shown in FIG. 2.

In some embodiments, the bit line tracking current Ion is configured to simulate a worst case scenario for a change in the total read current Iread. In some embodiments, the total read current Iread is expressed by formula 1:

$$\text{Total } Iread = (Iread1 * a) - (Ioff * b) \quad (1)$$

where Total Iread is the total read current in memory circuit 400, Iread1 is the total read current for each of the bit line tracking cells 402, a is the number of rows of current tracking cells 402, Ioff is the total bit line current for each of the capacitance tracking cells 404 and b is the number of rows of capacitance tracking cells 404.

In some embodiments, the number of rows of current tracking cells 402 corresponds to a number of bits. In some embodiments, the number of rows of capacitance tracking cells 404 corresponds to a number of bits.

Figure 5A:
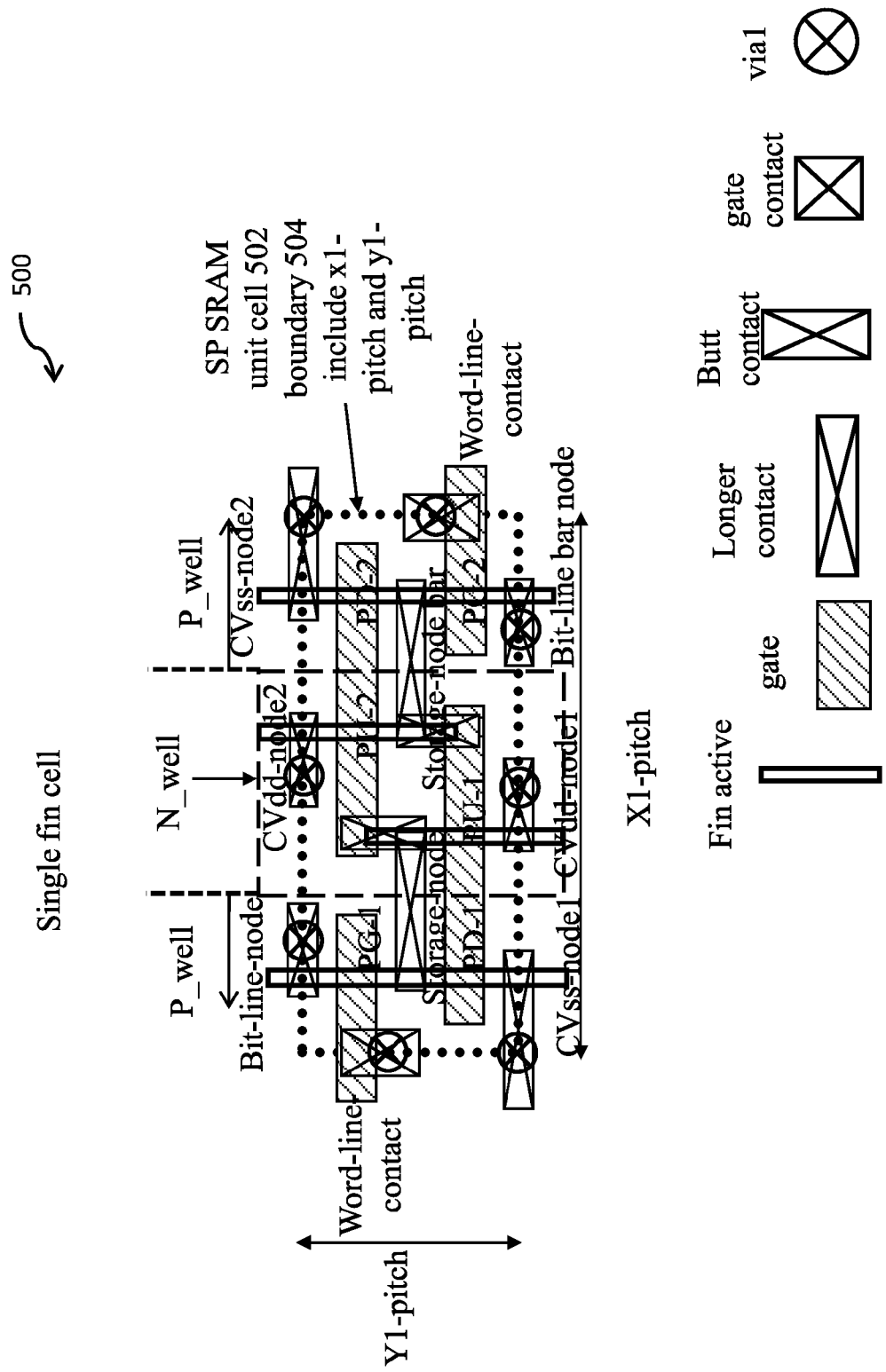
FIG. 5A is a portion of a layout diagram of the memory cell in FIG. 1A in accordance with one or more embodiments.

FIG. 5A is a portion of a layout diagram 500 of the memory cell 100A in FIG. 1A in accordance with one or more embodiments. The components of the layout diagram 500 shown in FIG. 5A are the same or are similar to those depicted in FIGS. 1A-1B with the same reference number, and the detailed description thereof is omitted. While layout diagram 500 illustrates vias (e.g., via1), the first metal layer is not shown for ease of viewing. The metal layer M0 (not shown) includes the gate contact, the butt contact and the longer contact. In some embodiments, the gate contact, the butt contact and the longer contact are referred to as local interconnects (LI).

Layout diagram 500 is an embodiment of a single-fin memory cell. Layout diagram 500 includes an N-well region N_well, and P-Well regions P_Well1 and P_well-1. A cell boundary 504 defines a unit cell 502. Unit cell 502 comprises transistor devices PU-1, PU-2, PD-1, PD-2, PG-1 and PG-2. In some embodiments, the unit cell 502 is a 6 transistor (6T) configuration. In some embodiments, the shape of the unit cell 502 is a rectangular cell shape. The unit cell 502 comprises a first X-pitch X1 and a first Y-pitch Y1. In some embodiments, unit cell 502 is a single-fin memory cell configured to be connected to a write assist circuitry.

The PU transistors (e.g., PD-1 and PD-2) of layout 500 shown in FIG. 5A comprises a first channel width (fin width-1), and a second channel width (fin width-2). In some embodiments, the first channel width (fin width-1) is wider than the second channel width (fin width-2) by at least 10%.

Figure 5B:
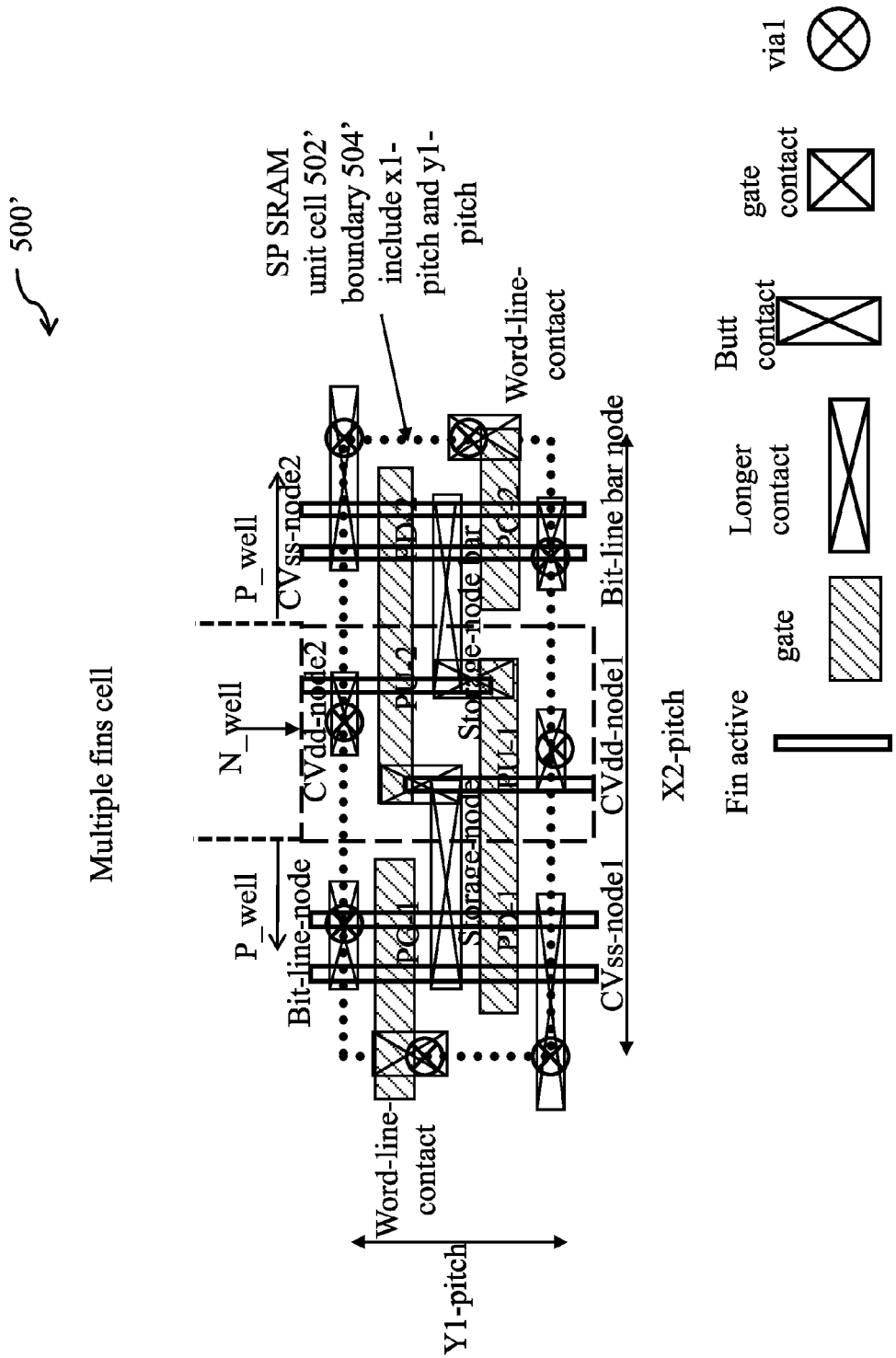
FIG. 5B is a portion of a layout diagram of the memory cell in FIG. 5A in accordance with one or more embodiments.

FIG. 5B is a portion of a layout diagram 500' of the memory cell 500A in FIG. 5A in accordance with one or more embodiments. The components of the layout diagram 500' shown in FIG. 5B are the same or are similar to those depicted in FIGS. 1A-1B with the same reference number, and the detailed description thereof is omitted. While layout diagram 500' illustrates vias (e.g., via1), the first metal layer is not shown for ease of viewing. The metal layer M0 (not shown) includes the gate contact, the butt contact and the longer contact. In some embodiments, the gate contact, the butt contact and the longer contact are referred to as local interconnects (LI).

Layout diagram 500' is an embodiment of a hybrid multiple-fin/single fin memory cell. For example, as shown in FIG. 5B, transistor devices PU-1 and PU-2 are single fin transistor devices, and transistor devices PD-1, PD-2, PG-1 and PG-2 are multiple-fin transistor devices.

Layout diagram 500' includes an N-well region N_well, and P-Well regions P_Well-1 and P_well-1. A cell boundary 504' defines a unit cell 502'. Unit cell 502' comprises transistor devices PU-1, PU-2, PD-1, PD-2, PG-1 and PG-2. In some embodiments, the unit cell 502' is a 6T configuration. In some embodiments, the shape of the unit cell 502' is a rectangular cell shape. The unit cell 502' comprises a second X-pitch X2 and a second Y-pitch Y2. In some embodiments, the second X-pitch X2 is greater than the first X-pitch X1. In some embodiments, the first Y-pitch Y1 is substantially equal to the second Y-pitch Y2. In some embodiments, unit cell 502' includes a multiple-fin/single fin hybrid memory cell configured to not be connected to a write assist circuitry. In some embodiments, the cell pitch ratio of X2 to Y1 (X2/Y1) is substantially equal to 2.8. In some embodiments, a length ratio of X2 to X1 (X2/X1) is substantially equal to 1.235.

In some embodiments, transistor device PD-1 comprises at least two transistor devices connected in parallel, such that the source terminals for each transistor are connected together, the drain terminals for each transistor are connected together, and the gate terminals for each transistor are connected together.

In some embodiments, transistor device PD-2 comprises at least two transistor devices connected in parallel, such that the source terminals for each transistor are connected together, the drain terminals for each transistor are connected together, and the gate terminals for each transistor are connected together.

In some embodiments, transistor device PG-1 comprises at least two transistor devices connected in parallel, such that the source terminals for each transistor are connected together, the drain terminals for each transistor are connected together, and the gate terminals for each transistor are connected together.

In some embodiments, transistor device PG-2 comprises at least two transistor devices connected in parallel, such that the source terminals for each transistor are connected together, the drain terminals for each transistor are connected together, and the gate terminals for each transistor are connected together.

Figure 6A:
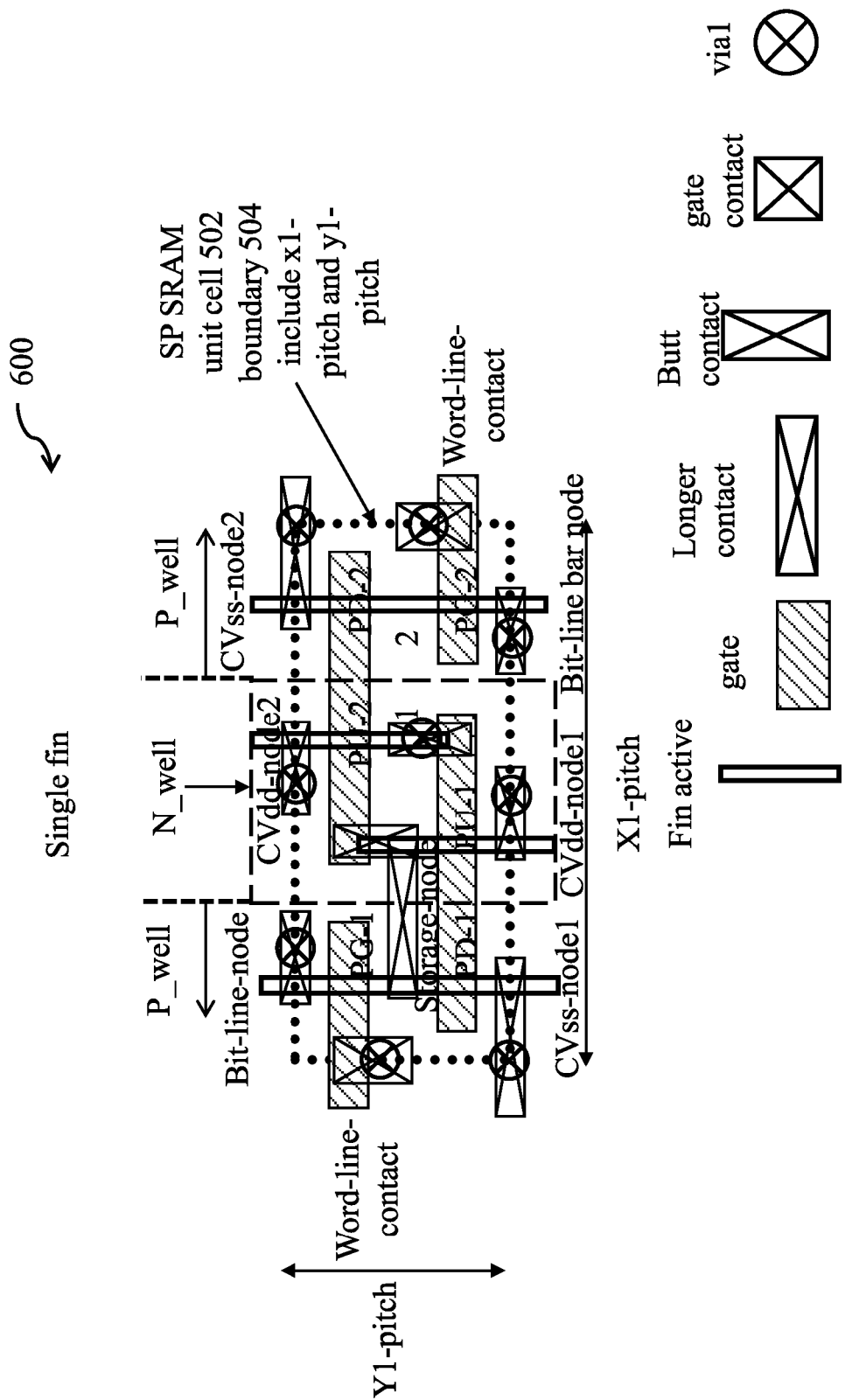
FIG. 6A is a portion of a layout diagram of the memory cell in FIG. 1C in accordance with one or more embodiments.

FIG. 6A is a portion of a layout diagram 600 of the memory cell 100C in FIG. 1C in accordance with one or more embodiments. The components of the layout diagram 600 shown in FIG. 6A are the same or are similar to those depicted in FIGS. 1A-1C with the same reference number, and the detailed description thereof is omitted. While layout diagram 600 illustrates first vias (e.g., via1), the first metal layer is not shown for ease of viewing. The metal layer M0 (not shown) includes the gate contact, the butt contact and the longer contact. In some embodiments, the gate contact, the butt contact and the longer contact are referred to as local interconnects (LI).

In some embodiments, layout diagram 600 is an embodiment of layout diagram 500 (shown in FIG. 5A) with similar elements. As shown in FIG. 6A, similar elements have a same reference number as shown in FIG. 5A. In some embodiments, layout diagram 600 is a layout diagram of an SRAM current tracking cell (e.g., memory cell 100C). The layout diagram 600 is of a fully-single fin SRAM current tracking cell. The gate of the NMOS transistor PD-1 and the gate of the PMOS transistor PU-1 are electrically connected to the source voltage reference conductor CVdd line by a gate contact 1 and a first via.

Figure 6B:
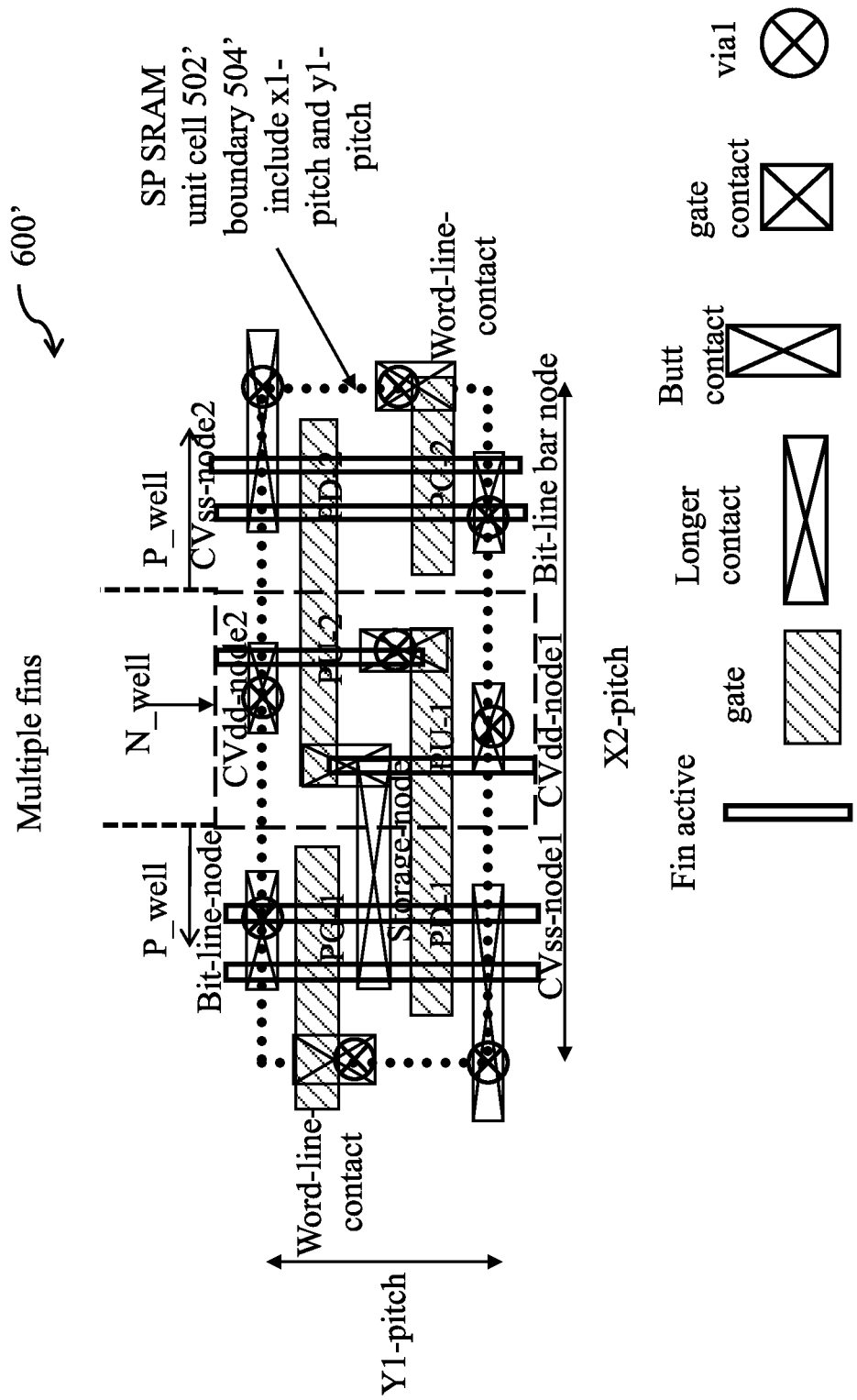
FIG. 6B is a portion of a layout diagram of the memory cell in FIG. 1C in accordance with one or more embodiments.

FIG. 6B is a portion of a layout diagram 600' of the memory cell 100C in FIG. 1C in accordance with one or more embodiments. The components of the layout diagram 600' shown in FIG. 6B are the same or are similar to those depicted in FIGS. 1A-1C with the same reference number, and the detailed description thereof is omitted. While layout diagram 600' illustrates first vias (e.g., via1), the first metal layer is not shown for ease of viewing. The metal layer M0 (not shown) includes the gate contact, the butt contact and the longer contact. In some embodiments, the gate contact, the butt contact and the longer contact are referred to as local interconnects (LI).

In some embodiments, layout diagram 600' is an embodiment of layout diagram 500' (shown in FIG. 5B) with similar elements. As shown in FIG. 6B, similar elements have a same reference number as shown in FIG. 5B. In some embodiments, layout diagram 600' is a layout diagram of an SRAM current tracking cell (e.g., memory cell 100C). The layout diagram 600' is of a multiple-fin SRAM current tracking cell. The gates of the NMOS transistor PD-1 and the gate of the PMOS transistor PU-1 are electrically connected to the source voltage reference conductor CVdd line by a gate contact 1 and a first via via1.

Figure 7A:
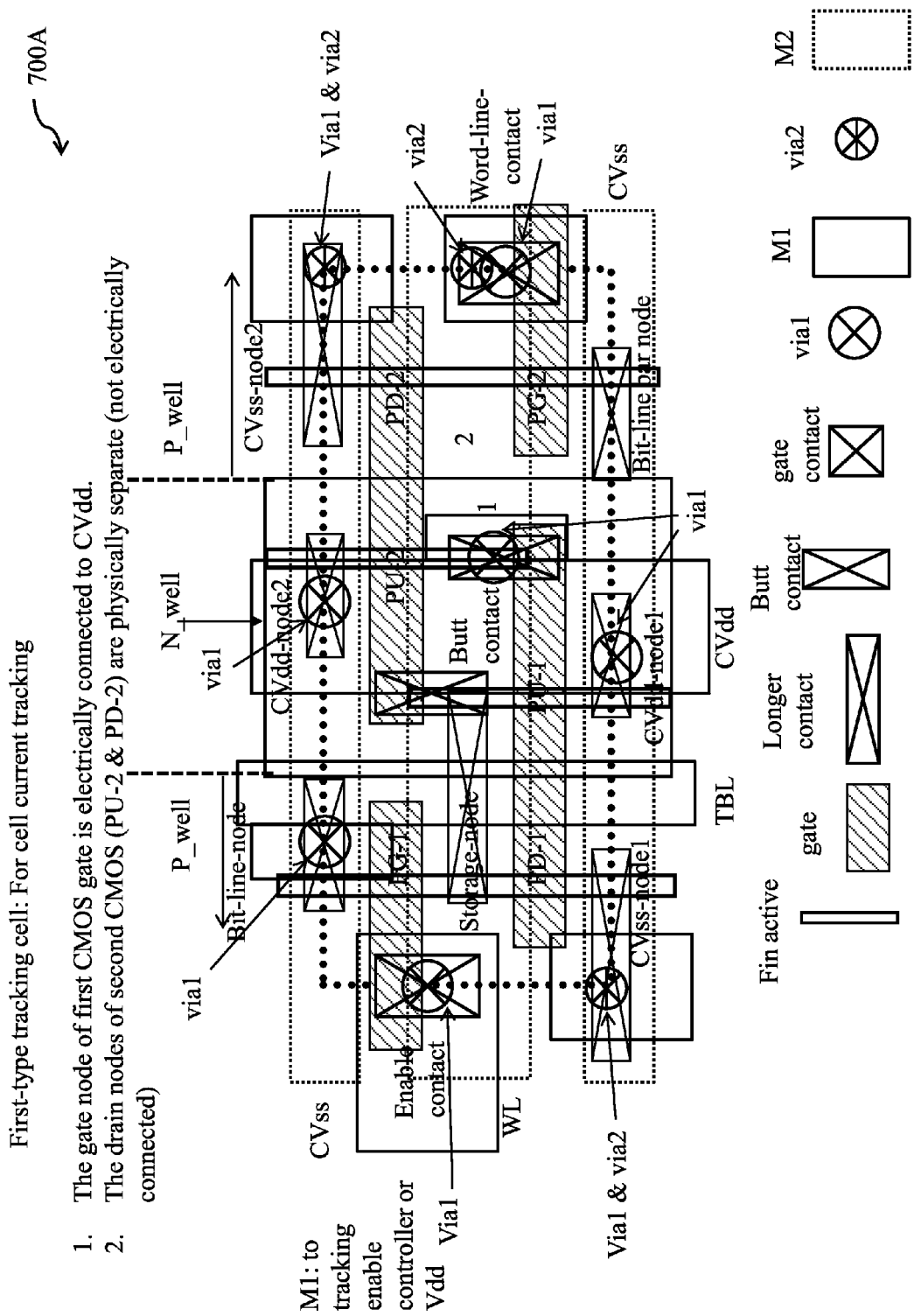
FIG. 7A is a portion of a layout diagram of the memory cell in FIG. 1C in accordance with one or more embodiments.

FIG. 7A is a portion of a layout diagram 700A of the memory cell 100C in FIG. 1C in accordance with one or more embodiments. The components of the layout diagram 700A shown in FIG. 7A are the same or are similar to those depicted in FIGS. 1A-1C with the same reference number, and the detailed description thereof is omitted. Layout diagram 700A is an embodiment of layout diagram 600 (shown in FIG. 6A) with similar elements. As shown in FIG. 7A, similar elements have a same reference number as shown in FIG. 6A. In some embodiments, layout diagram 700A is a layout diagram of an SRAM current tracking cell (e.g., memory cell 100C). The layout diagram 700A is of a fully-single fin SRAM current tracking cell.

In comparison with the layout diagram 600 (shown in FIG. 6A), layout diagram 700A includes metal layer M1, metal layer M2, and a plurality of second vias via2. The metal layer M0 includes the gate contact, the butt contact and the longer contact.

The gate of the NMOS transistor PD-1 and the gate of the PMOS transistor PU-1 are electrically connected to the source voltage reference conductor CVdd line by a gate contact 1 and a first via via1.

Metal layer M0 is located below metal layer M1. Metal layer M0 electrically connects the gate and drain of the current tracking cell to other metal layers (e.g., metal layer M1, metal layer M2, metal layer M3). Metal layer M0 comprises one or more local interconnects. The local interconnects comprise contacts (e.g., longer contact, butt contact and gate contact) of the current tracking cell of FIG. 7A.

Zero via via-0 electrically connects metal layer M0 to metal layer M1.

Metal layer M1 is located below metal layer M2. Metal layer M1 electrically connects metal layer M2 to metal layer M0 by first via via1.

Metal layer M2 is located below metal layer M3. Metal layer M2 electrically connects metal layer M3 to metal layer M1 by second via via2.

The source voltage reference conductor CVdd is located on metal layer M1. The tracking bit line TBL source voltage reference conductor CVdd is located on metal layer M1.

The ground reference conductor CVss is located on metal layer M2. The word line WL conductor is located on metal layer M2.

Figure 7B:
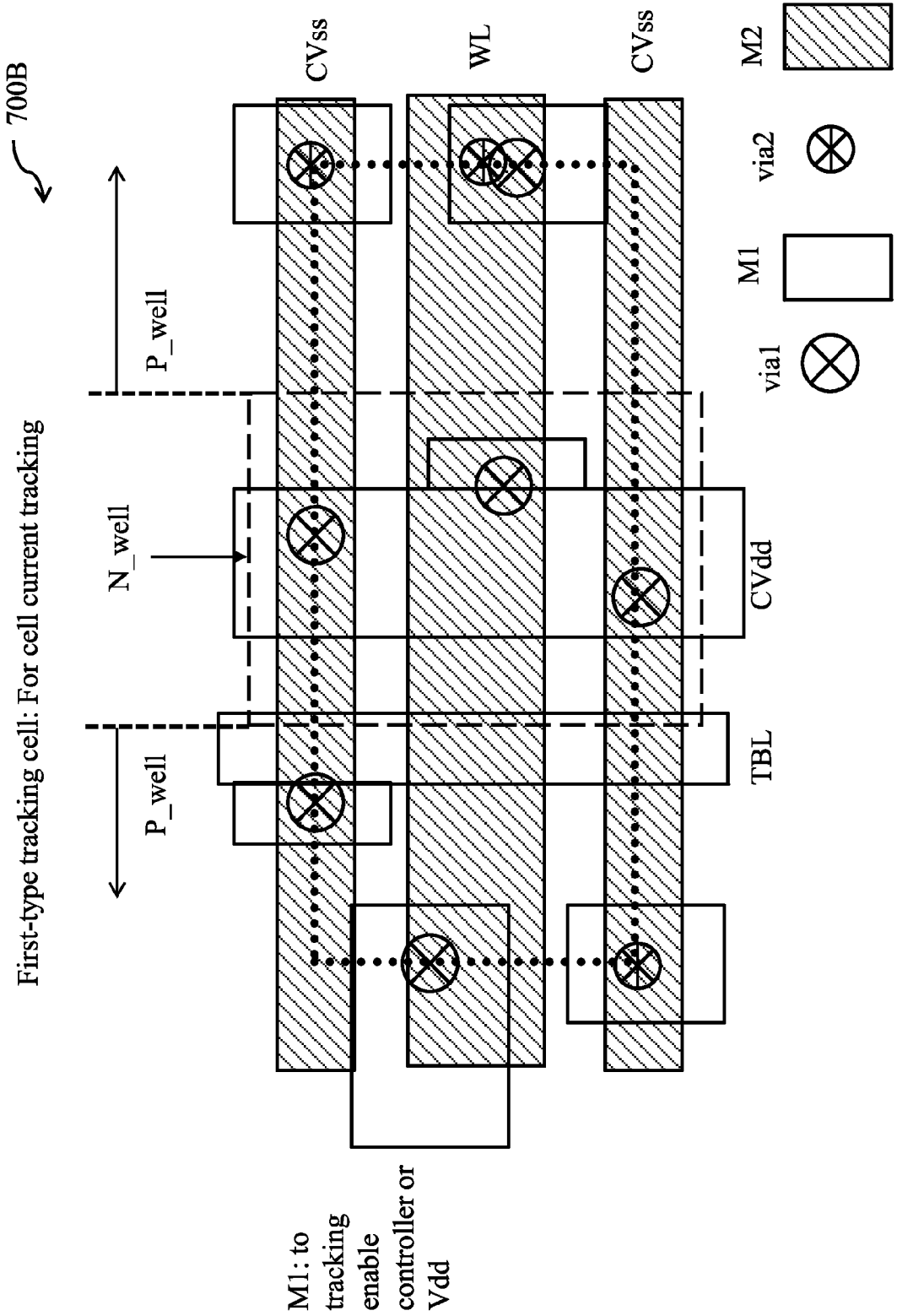
FIG. 7B is a portion of a layout diagram of the memory cell in FIG. 1C in accordance with one or more embodiments.

FIG. 7B is a portion of a layout diagram 700B of the memory cell 100C in FIG. 1C in accordance with one or more embodiments. The components of the layout diagram 700B shown in FIG. 7B are the same or are similar to those depicted in FIGS. 1A-1C and FIG. 7A with the same reference number, and the detailed description thereof is omitted. Layout diagram 700B is an embodiment of layout diagram 700A (shown in FIG. 7A) with similar elements. As shown in FIG. 7B, similar elements have a same reference number as shown in FIG. 7B. In comparison with layout diagram 700A (shown in FIG. 7A), layout diagram 700B does not include the gates, the fin actives, the longer contacts, the butt contacts and the gate contacts (for illustrative purposes).

Figure 7C:
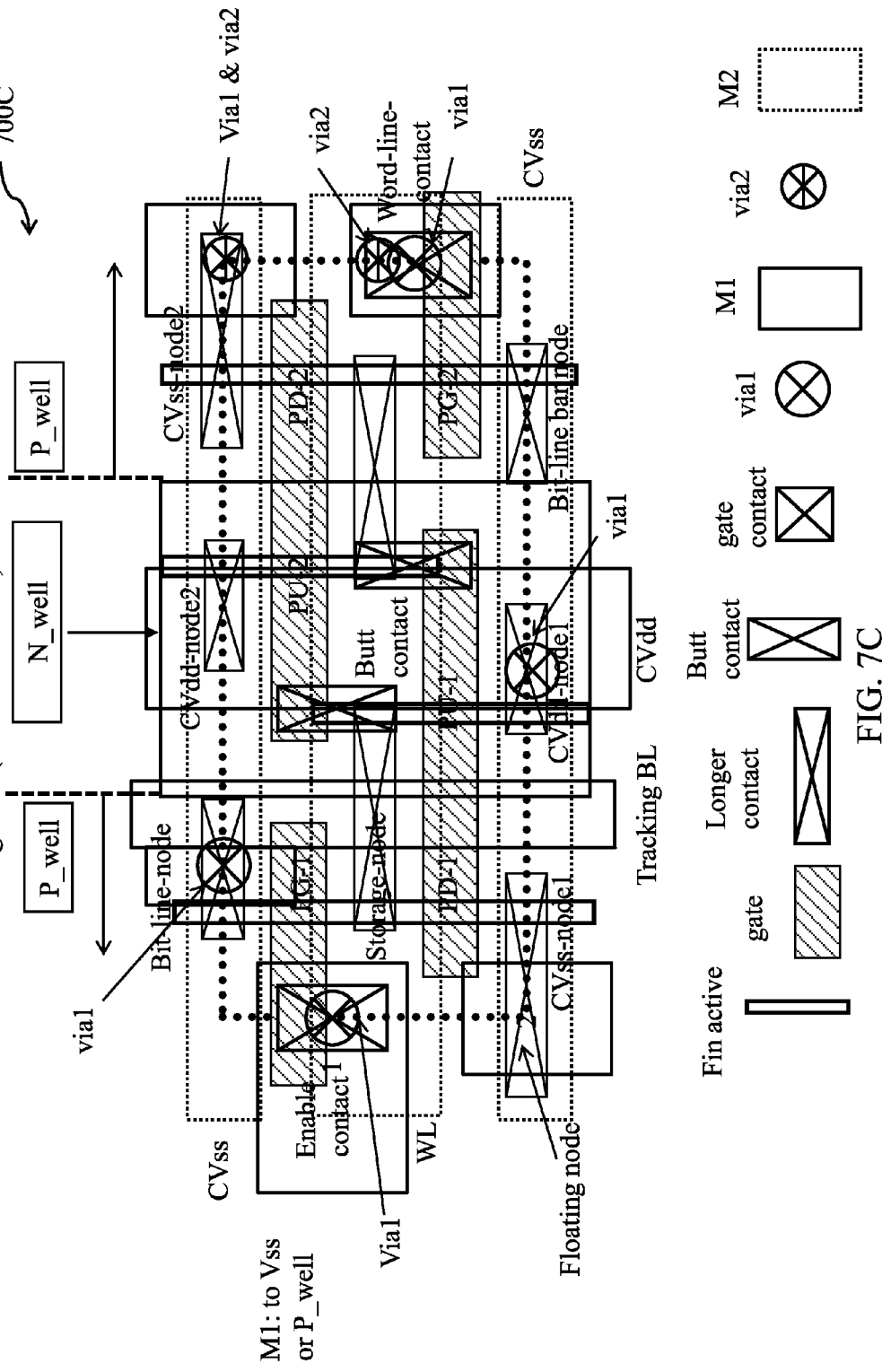
FIG. 7C is a layout diagram of the memory cell in FIG. 1D in accordance with one or more embodiments.

FIG. 7C is a layout diagram 700C of the memory cell 100D in FIG. 1D in accordance with one or more embodiments. The components of the layout diagram 700C shown in FIG. 7C are the same or are similar to those depicted in FIGS. 1A-1C and FIG. 7A with the same reference number, and the detailed description thereof is omitted. Layout diagram 700C is an embodiment of layout diagram 700A (shown in FIG. 7A) with similar elements. As shown in FIG. 7C, similar elements have a same reference number as shown in FIG. 7A. In some embodiments, layout diagram 700C is a layout diagram of an SRAM bit line capacitance tracking cell (e.g., memory cell 100D). The layout diagram 700C is of a fully-single fin SRAM bit line capacitance tracking cell. Although layout diagram 700C is of a fully-single fin SRAM bit line capacitance tracking cell, alternative embodiments exist herein where the layout diagram 700B is of a multiple-fin SRAM bit line capacitance tracking cell.

In comparison with the layout diagram 600 (shown in FIG. 6A), layout diagram 700A includes metal layer M1, metal layer M2, and a plurality of second vias via2. The metal layer M0 includes the gate contact, the butt contact and the longer contact.

In some embodiments, the gate of the NMOS transistor PG-1 is electrically connected to the ground reference conductor CVss by a contact (e.g., gate contact or butt contact) and a first via via1. In some embodiments, the gate of the NMOS transistor PG-1 is electrically connected to the P-well P_Well of the NMOS transistor PG-1. The source node of the NMOS transistor PD-1 is electrically floating.

The source voltage reference conductor CVdd is located on metal layer M1. The tracking bit line TBL source voltage reference conductor CVdd is located on metal layer M1.

The ground reference conductor CVss is located on metal layer M2. The word line WL conductor is located on metal layer M2.

Figure 7D:
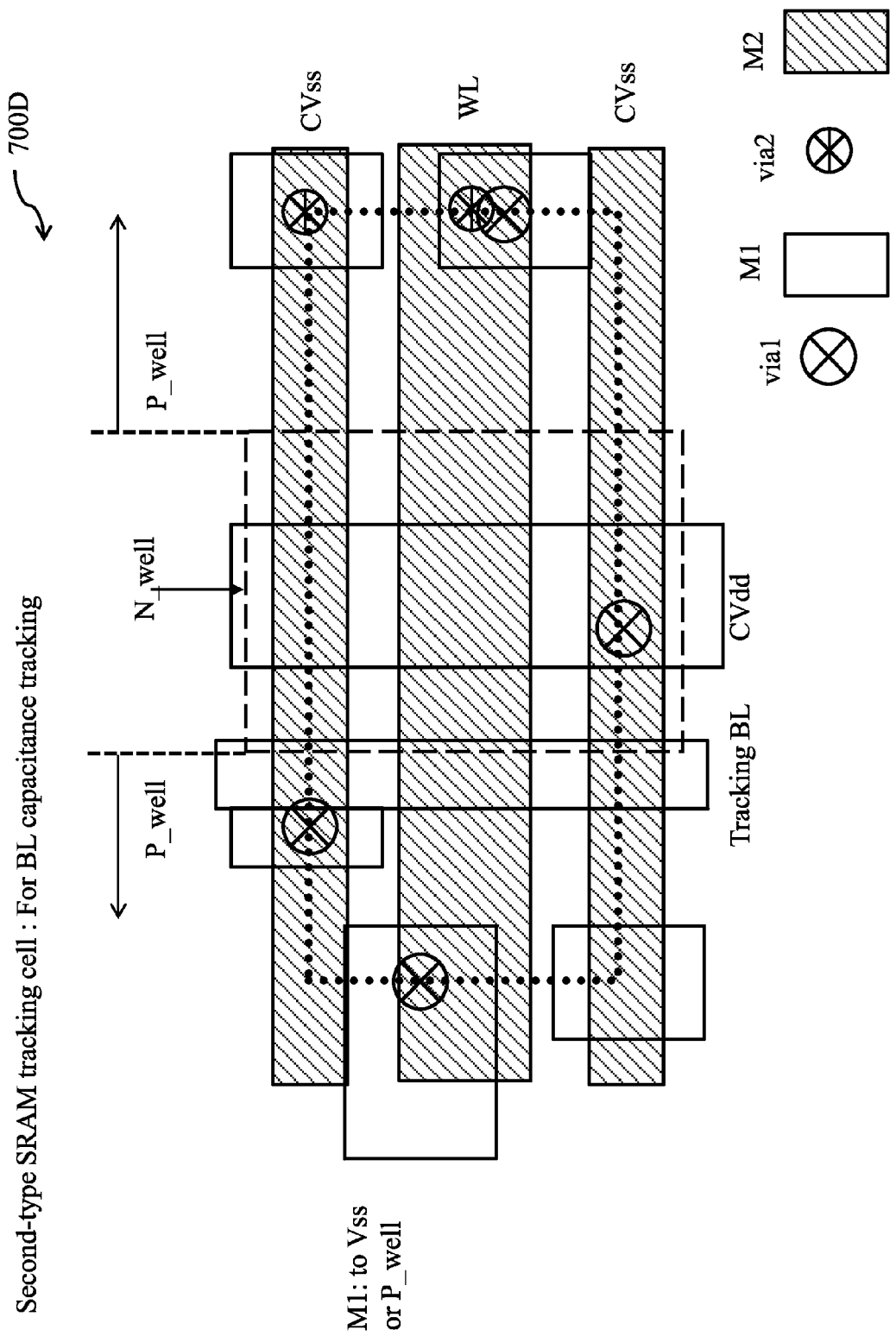
FIG. 7D is a portion of a layout diagram of the memory cell in FIG. 1D in accordance with one or more embodiments.

FIG. 7D is a portion of a layout diagram 700C of the memory cell 100D in FIG. 1D in accordance with one or more embodiments. The components of the layout diagram 700D shown in FIG. 7D are the same or are similar to those depicted in FIGS. 1A-1B, FIG. 1D and FIG. 7C with the same reference number, and the detailed description thereof is omitted. Layout diagram 700D is an embodiment of layout diagram 700C (shown in FIG. 7C) with similar elements. As shown in FIG. 7D, similar elements have a same reference number as shown in FIG. 7C. In comparison with layout diagram 700C (shown in FIG. 7C), layout diagram 700D does not include the gates, the fin actives, the longer contacts, the butt contacts and the gate contacts (for illustrative purposes).

Figure 8A:
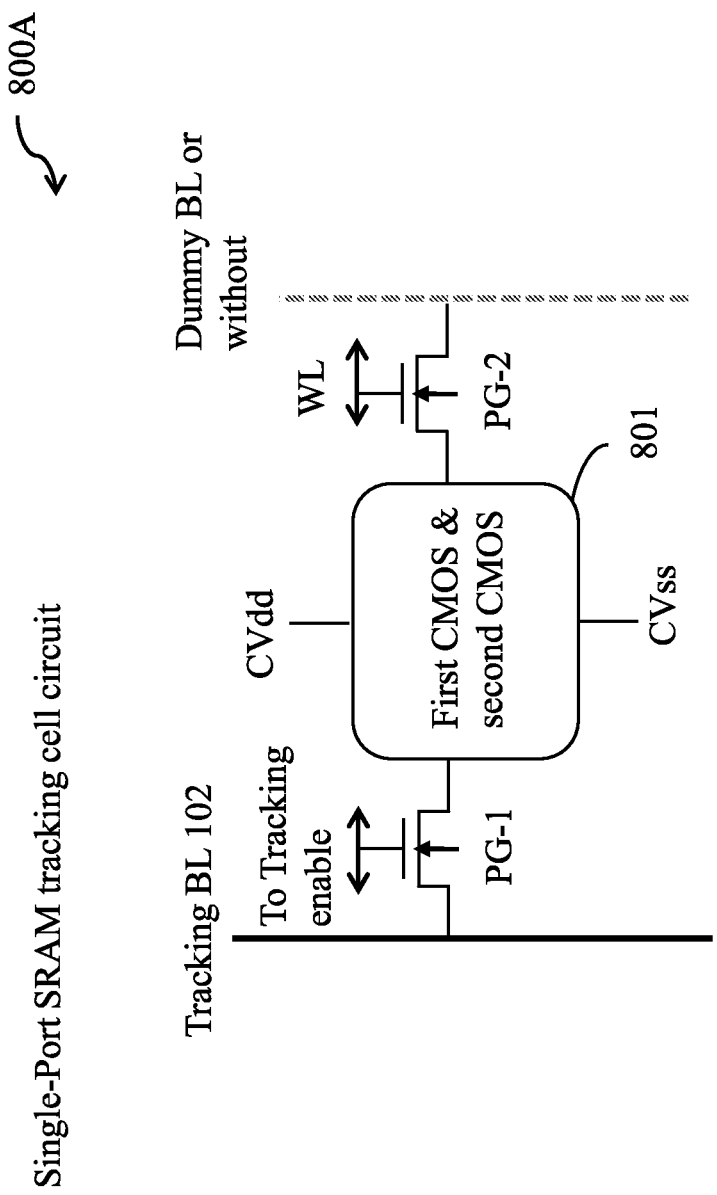
FIG. 8A is a schematic diagram of a memory cell in accordance with one or more embodiments.

FIG. 8A is a schematic diagram of a memory cell 800A in accordance with one or more embodiments. Memory cell 800A is an embodiment of the memory cell 100A (shown in FIG. 1A) with similar elements. As shown in FIG. 1C, similar elements have a same reference number as shown in FIG. 1A. CMOS 801 is an embodiment of CMOS 101 (shown in FIG. 1B) with similar elements. In some embodiments, memory cell 800A is an SRAM tracking cell. In some embodiments, memory cell 800A is an SRAM current tracking cell. In some embodiments, memory cell 800A is an SRAM bit line capacitance tracking cell.

In comparison with memory cell 100A (shown in FIG. 1A), the bit line BL of memory cell 100A is replaced with a tracking bit line 102 of memory cell 801. In some embodiments, a dummy bit line of memory cell 801 shown in FIG. 1C replaces the bit line bar BLB of memory cell 100A. In some embodiments, a floating node of memory cell 800A shown in FIG. 8A replaces the bit line bar BLB of memory cell 100A.

CMOS 801 comprises a first CMOS and a second CMOS. The first CMOS is an embodiment of cross-coupled inverter 102 shown in FIG. 1B. The second CMOS is an embodiment of cross-coupled inverter 104 shown in FIG. 1B.

Figure 8B:
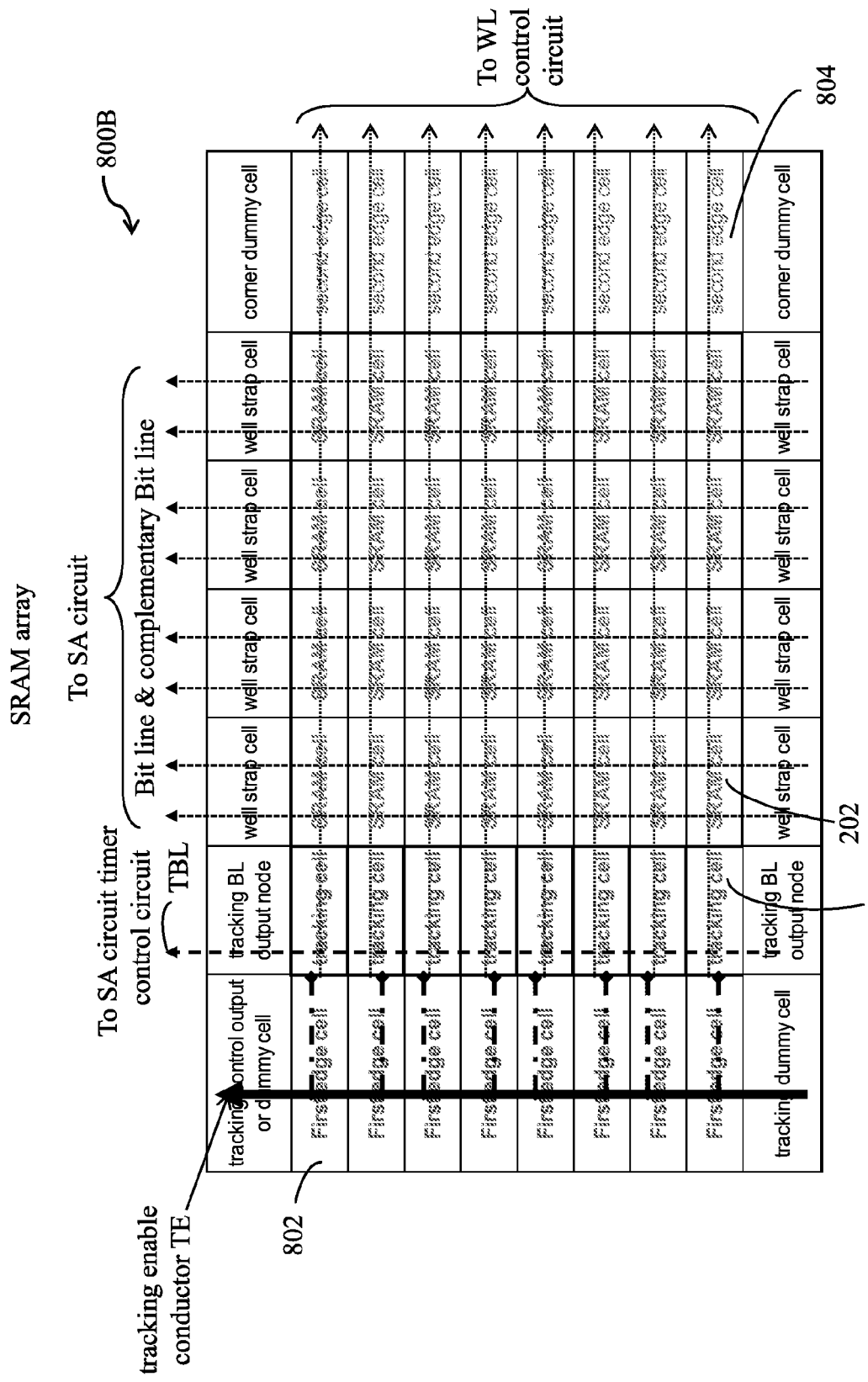
FIG. 8B is a block diagram of a memory cell array in accordance with one or more embodiments.

FIG. 8B is a block diagram of a memory cell array 800B in accordance with one or more embodiments. Memory cell array 800B is an embodiment of memory cell array 200 (shown in FIG. 2) with similar elements. As shown in FIG. 8A, similar elements have a same reference number as shown in FIG. 2.

A plurality of tracking cells 201 are arranged in a first column. The first column is adjacent to an edge column of the SRAM cells 202. In some embodiments, each of the tracking cells 201 shown in memory cell array 800B of FIG. 8B are an embodiment of the memory cells shown in FIGS. 1A-1B and 8A.

Memory cell array 800B comprises a plurality of first edge cells 802 and a plurality of second edge cells 804.

The plurality of first edge cells 802 are arranged in a second column. The second column is adjacent to the first column. The plurality of first edge cells 802 are adjacent to the tracking cells 201. In some embodiments, the plurality of first edge cells 802 are located on an edge of the memory cell array 800B.

The plurality of second edge cells 804 are arranged in a third column. The third column is adjacent to the plurality of columns of the SRAM cells 802. The plurality of second edge cells 804 are adjacent to an outer edge of the SRAM cells 802. In some embodiments, the plurality of second edge cells 804 are located on an edge of the memory cell array 800B.

The first edge cells 802 comprise the tracking enable conductor TE. In some embodiments, a cell size of each of the SRAM cells 802 and a cell size of each of the tracking cells 201 are substantially the same.

The tracking enable line TE is electrically connected to each of the tracking cells 201. In some embodiments, the tracking enable line TE is electrically connected to first edge cells 802. In some embodiments, the tracking enable line TE is a metal conductive layer located above the first edge cells 802. In some embodiments, the tracking enable line TE is electrically connected to each of the NMOS transistors PG-1 in each tracking cell 201. In some embodiments, by electrically connecting the tracking enable line TE to each of the NMOS transistors PG-1 in each tracking cell 201, each tracking cell 201 can be utilized as a cell current tracking cell 204.

Figure 8C:
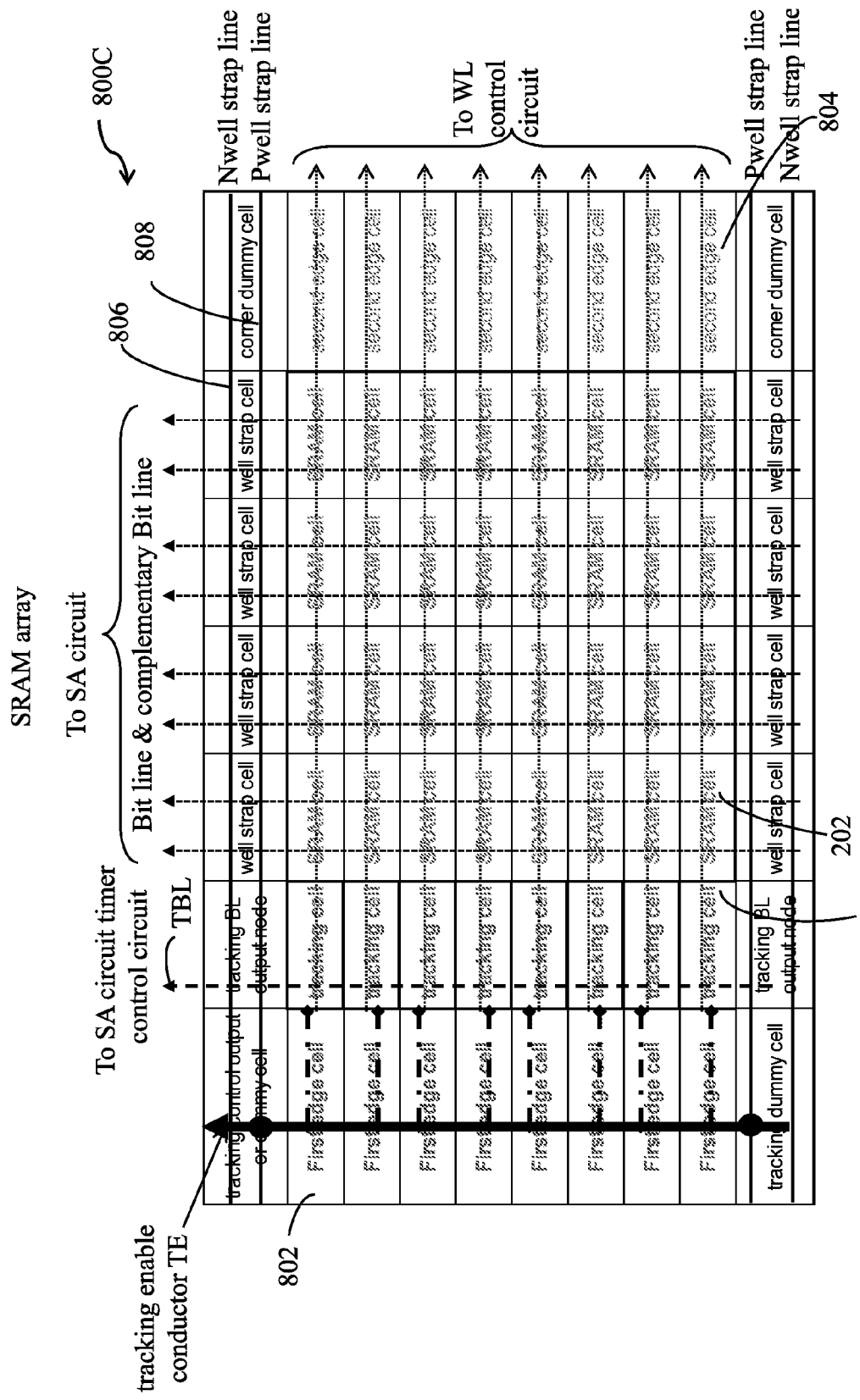
FIG. 8C is a block diagram of a memory cell array in accordance with one or more embodiments.

FIG. 8C is a block diagram of a memory cell array 800C in accordance with one or more embodiments. Memory cell array 800C is an embodiment of memory cell array 800B (shown in FIG. 8B) with similar elements. As shown in FIG. 8C, similar elements have a same reference number as shown in FIG. 8B.

In comparison with memory cell array 800C (shown in FIG. 8C), memory cell array 800C includes N-well strap line 806 and P-well strap line 808.

N-well strap line 806 is a conductive line which electrically connects the N-well of a plurality of memory cells. In some embodiments, N-well strap line 806 electrically connects the N-well of a common row. In some embodiments, N-well strap line 806 electrically connects the N-well of an uppermost row of the memory cell array 800C. In some embodiments, the uppermost row and the bottommost row of the memory cell array 800C are located at opposing ends of each other. In some embodiments, N-well strap line 806 electrically connects the N-well of a bottommost row of the memory cell array 800C. In some embodiments, memory cell array 800C includes a plurality of N-well strap lines 806. In some embodiments, each of the N-well strap lines 806 are electrically connected to the tracking enable line TE. In some embodiments, by electrically coupling the tracking enable line TE to each of the N-well strap lines 806, the NMOS transistor PG-1 of each tracking cell 201 are configured to be connected to ground reference conductor CVss. In some embodiments, by electrically coupling the tracking enable line TE to each of the N-well strap lines 806, each tracking cell 201 can be utilized as a bit line capacitance tracking cell 206.

P-well strap line 808 is a conductive line which electrically connects the P-well of a plurality of memory cells. In some embodiments, P-well strap line 808 electrically connects the P-well of a common row. In some embodiments, P-well strap line 808 electrically connects the P-well of an uppermost row of the memory cell array 800C. In some embodiments, P-well strap line 808 electrically connects the P-well of a bottommost row of the memory cell array 800C. In some embodiments, memory cell array 800C includes a plurality of P-well strap lines 808.

Figure 9A:
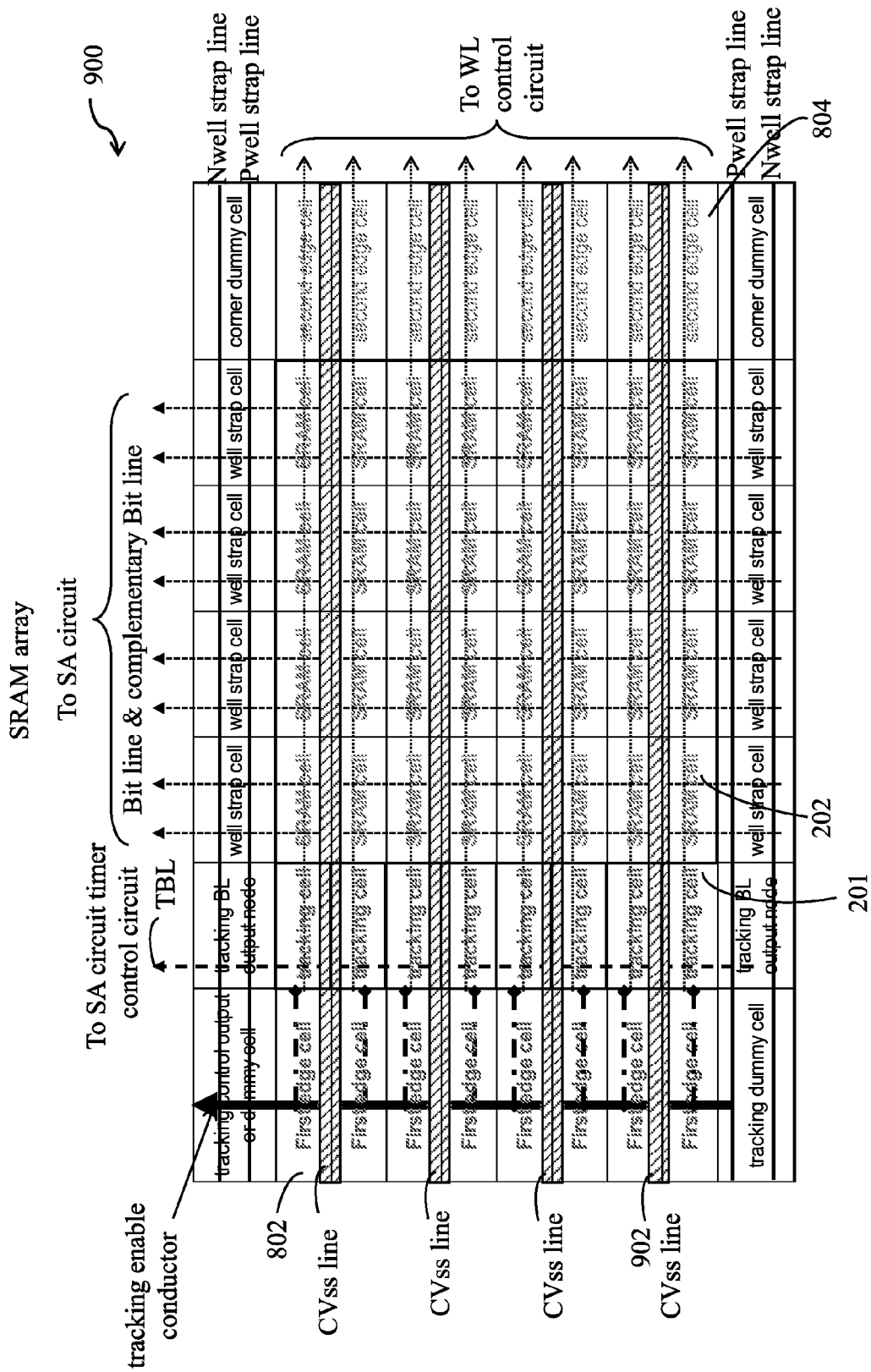
FIG. 9A is a block diagram of a memory cell array in accordance with one or more embodiments.

FIG. 9A is a block diagram of a memory cell array 900 in accordance with one or more embodiments. Memory cell array 900 is an embodiment of memory cell array 800C (shown in FIG. 8C) with similar elements. As shown in FIG. 9A, similar elements have a same reference number as shown in FIG. 8C.

In comparison with memory cell array 800C (shown in FIG. 8C), the tracking enable line TE is not electrically connected to each of the N-well strap lines 806 in memory cell array 900. In comparison with memory cell array 800C (shown in FIG. 8C), memory cell array 900 includes one or more ground reference conductors CVss 902.

One or more of the ground reference conductors CVss 902 extend across the memory cell array 900. In some embodiments, each of the ground reference conductors CVss 902 physically extend to the first edge cell 802. In some embodiments, the tracking enable line TE is electrically connected to each of the ground reference conductors CVss 902. In some embodiments, by electrically coupling the tracking enable line TE to each of the ground reference conductors CVss 902, each tracking cell 201 can be utilized as a bit line capacitance tracking cell 206.

Figure 9B:
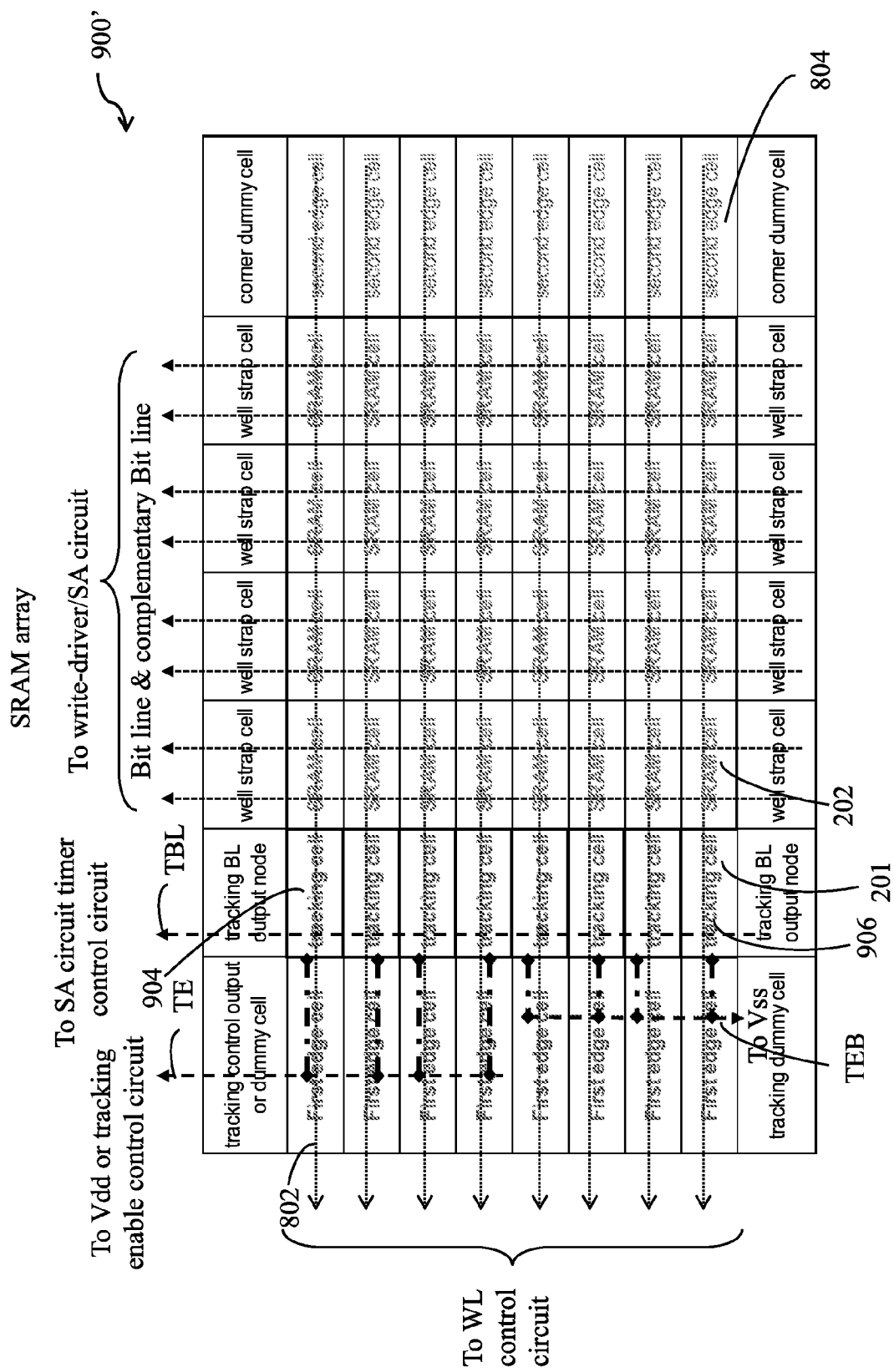
FIG. 9B is a block diagram of a memory cell array in accordance with one or more embodiments.

FIG. 9B is a block diagram of a memory cell array 900' in accordance with one or more embodiments. Memory cell array 900' is an embodiment of memory cell array 800B (shown in FIG. 8B) with similar elements. As shown in FIG. 9B, similar elements have a same reference number as shown in FIG. 8B. Memory cell array 900' is an embodiment of memory cell array 200 (shown in FIG. 2) with similar elements. In comparison with memory cell array 800B (shown in FIG. 8B), memory cell array 900' comprises a tracking disable line TEB.

Tracking cells 201 comprises tracking cells 904 and tracking cells 906. Tracking cells 904 are an embodiment of tracking cells 201. Tracking cells 906 are an embodiment of tracking cells 201.

Tracking cells 201 are divided into one or more tracking cells 904 and one or more tracking cells 906. In some embodiments, tracking cells 904 and tracking cells 906 are functionally equivalent.

The tracking enable line TE is electrically connected to a portion of the tracking cells 201 (e.g., tracking cells 904). In some embodiments, the tracking enable line TE is electrically connected to the tracking enable control circuit (not shown). In some embodiments, the tracking enable line TE is electrically connected to the source voltage reference conductor Vdd (not shown). In some embodiments, the number of tracking cells 904 electrically connected to the tracking enable line TE ranges from 1 cell to 512 cells. In some embodiments, the tracking enable line TE does not extend across each of the first edge cells 802. In some embodiments, the tracking enable line TE is a metal conductive layer located above the first edge cells 802. In some embodiments, by electrically connecting the tracking enable line TE to each of the NMOS transistors PG-1 in tracking cell 904, each tracking cell 904 can be utilized as a cell current tracking cell 204. In some embodiments, the gate of the first CMOS devices within each of tracking cells 904 is electrically connected to the source voltage reference conductor CVdd.

The tracking disable line TEB is electrically connected to a portion of the tracking cells 201 (e.g., tracking cells 906). In some embodiments, the tracking disable line TEB is electrically connected to ground reference conductor CVss. In some embodiments, the number of tracking cells 906 electrically connected to the tracking disable line TEB ranges from 1 cell to 512 cells. In some embodiments, the tracking disable line TEB does not extend across each of the first edge cells 802. In some embodiments, the tracking disable line TEB is a metal conductive layer located above the first edge cells 802. In some embodiments, by electrically connecting the tracking disable line TEB to each of the NMOS transistors PG-1 in tracking cell 906, each tracking cell 906 can be utilized as a bit line capacitance tracking cell 206. In some embodiments, a drain node of the second CMOS devices within each of the tracking cells 906 is electrically isolated.

Figure 10:
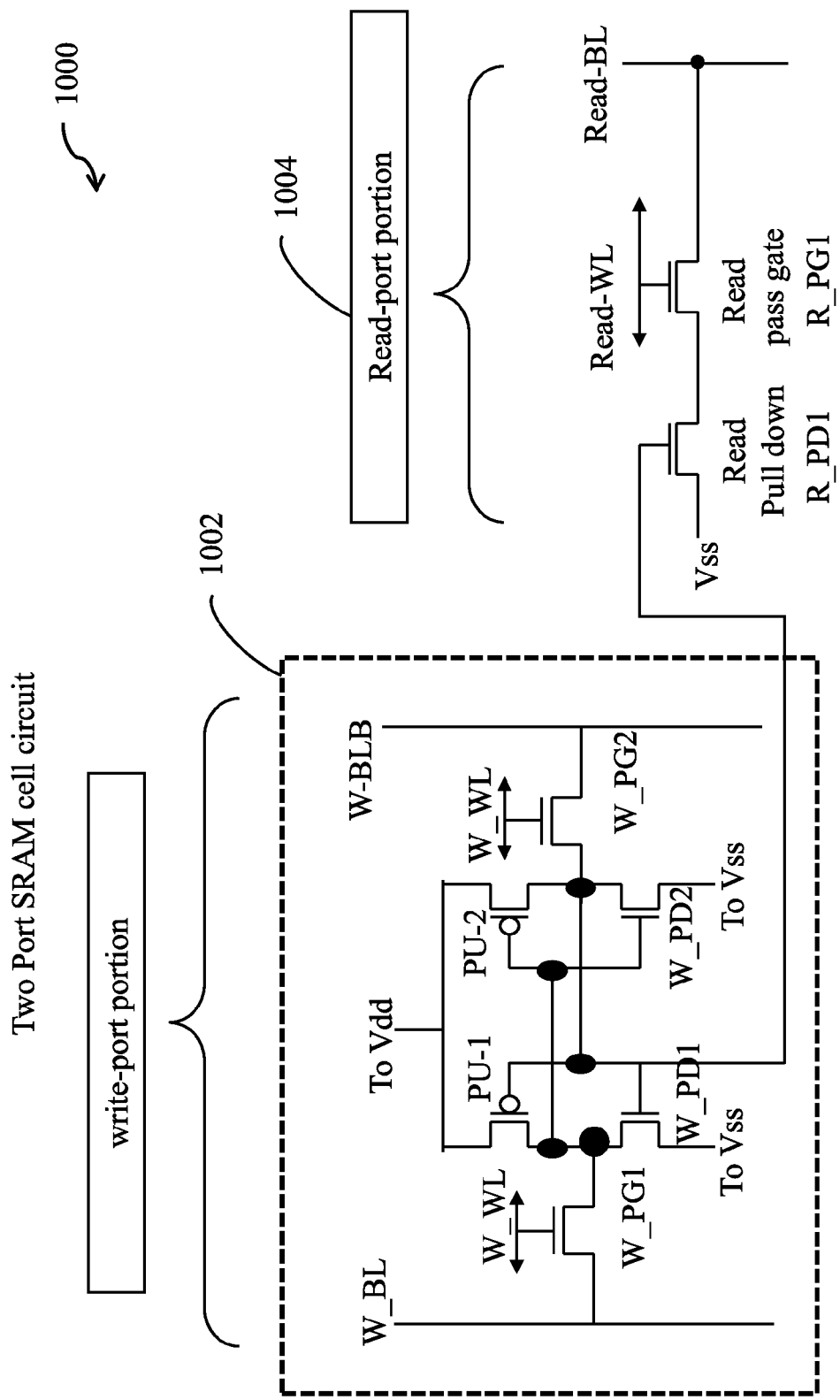
FIG. 10 is a schematic diagram of a memory cell in accordance with one or more embodiments.

FIG. 10 is a schematic diagram of a memory cell 1000 in accordance with one or more embodiments. Memory cell 1000 is an embodiment of the memory cell 100A (shown in FIG. 1A) with similar elements. As shown in FIG. 10, similar elements have a same reference number as shown in FIG. 1A. In comparison with memory cell 100A (shown in FIG. 1A), memory cell 1000 includes NMOS transistor R_PD-1 and NMOS transistor R_PG-1. In some embodiments, memory cell 1000 is a portion of one or more two port (2P) SRAM cells. In some embodiments, memory cell 1000 is a portion of an embedded SRAM memory cell array. In some embodiments, additional write ports and/or read ports are a part of memory cell 1000. In some embodiments, memory cell 1000 employs a number of transistors other than eight. In some embodiments, memory cell 1000 is usable in a memory cell array.

Memory cell 1000 comprises a write port portion 1002 and a read port portion 1004.

Write port portion 1002 is an embodiment of the memory cell 100A (shown in FIG. 1A) with similar elements. Write bit line W_BL is an embodiment of bit line BL shown in FIG. 1A, write bit line bar W_BLB is an embodiment of bit line bar BLB shown in FIG. 1A, write word line W_WL is an embodiment of word line WL shown in FIG. 1A, NMOS transistor W_PG1 is an embodiment of NMOS transistor PG-1 shown in FIG. 1A, NMOS transistor W_PG2 is an embodiment of NMOS transistor PG-2 shown in FIG. 1A, NMOS transistor W_PD1 is an embodiment of NMOS transistor PD-1 shown in FIG. 1A and NMOS transistor W_PD2 is an embodiment of NMOS transistor PD-2 shown in FIG. 1A. Read port word line Read-WL is an embodiment of word line WL shown in FIG. 1A. Read bit line Read-BL is an embodiment of bit line BL shown in FIG. 1A Read portion 1004 comprises NMOS transistor R_PD-1, NMOS transistor R_PG-1, read port word line Read-WL and read bit line Read-BL.

The gate of NMOS transistor R_PD-1 is electrically connected to the gate of NMOS transistor W_PD1 and the gate of PMOS transistor PU-1. The source of NMOS transistor R_PD-1 is electrically connected to ground reference Vss. The drain of NMOS transistor R_PD-1 is electrically connected to NMOS transistor R_PG-1.

The gate of NMOS transistor R_PG-1 is electrically connected to read port word line Read-WL. NMOS transistor R_PG-1 is electrically connected to the read bit line R-BL.

Figure 11:
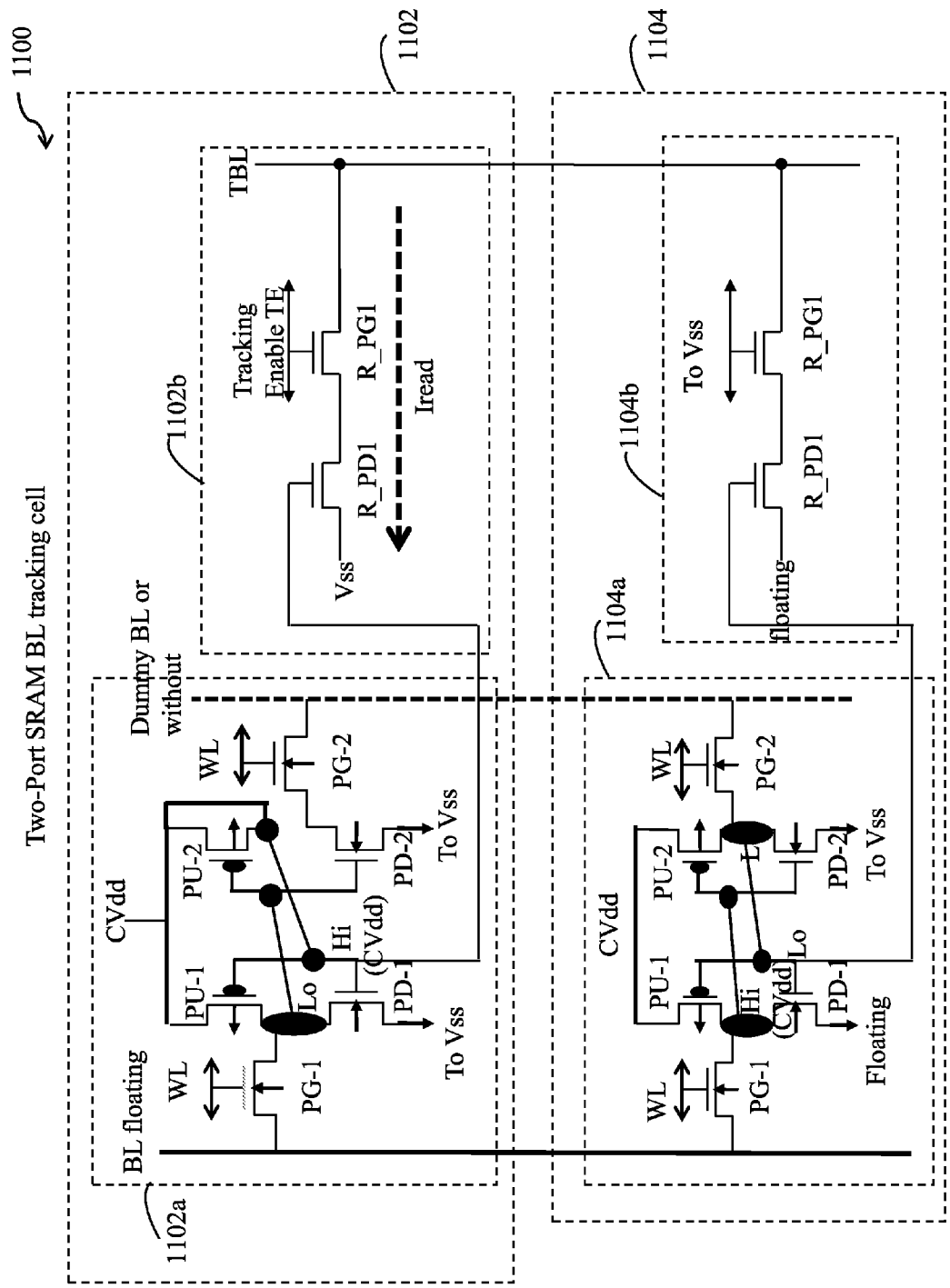
FIG. 11 is a schematic diagram of a memory cell in accordance with one or more embodiments.

The schematic diagram of memory cell 1000 is a basis to be modified to form other structures, such as those described herein, e.g., FIGS. 11, 12A-12B and 13A-13D. In some embodiments, memory cell 1000 is a basis to be modified to form memory cell array structures, such as those described herein, e.g., FIGS. 2, 3, 4, 8B-8C and 9A-9B. In some embodiments, write port portion 1002 is modified to include the features of memory cell 100C (as shown in FIG. 11 as write port portion 1102*a*). In some embodiments, write port portion 1002 is modified to form an SRAM current tracking cell. In some embodiments, write port portion 1002 is modified to include the features of memory cell 100D (as shown in FIG. 11 as write port portion 1104*a*). In some embodiments, write port portion 1002 is modified to form an SRAM bit line capacitance tracking cell.

FIG. 11 is a schematic diagram of a memory cell 1100 in accordance with one or more embodiments. Memory cell 1100 is an embodiment of memory cell 1000 (shown in FIG. 10) with similar elements. As shown in FIG. 11, similar elements have a same reference number as shown in FIG. 10. In comparison with memory cell 1000 (shown in FIG. 10), memory cell 1100 also includes memory cell 1104. In some embodiments, memory cell 1100 is a basis to be modified to form memory cell array structures, such as those described herein, e.g., FIGS. 2, 3, 4, 8B-8C and 9A-9B.

Memory cell 1100 comprises memory cell 1102 and memory cell 1104. Memory cell 1102 is electrically connected to memory cell 1104 by tracking bit line TBL. Tracking bit line TBL is an embodiment of read bit lit line Read-BL shown in FIG. 1000.

Memory cell 1102 is an embodiment of memory cell 1000 (shown in FIG. 10) with similar elements. As shown in FIG. 11, similar elements have a same reference number as shown in FIG. 10. Memory cell 1102 comprises a write port portion 1102*a* and a read port portion 1102*b*.

Write port portion 1102*a* is an embodiment of write port portion 1002 with similar elements. In comparison with write port portion 1002 (shown in FIG. 10), write port portion 1102*a* is modified to include the features of memory cell 100C (as shown in FIG. 1C). In some embodiments, memory cell 1102 is a 2P SRAM read bit line current tracking cell. In some embodiments, the bit line BL of the write port portion 1102a is floating. In some embodiments, the bit line bar BLB of the write port portion 1102a is a dummy bit line. In some embodiments, the bit line bar BLB of the write port portion 1102a is electrically floating.

Read port portion 1102b is an embodiment of read port portion 1004 with similar elements. In comparison with read port portion 1004 (shown in FIG. 10), read port portion 1102b is modified to form a 2P SRAM read bit line current tracking cell. In comparison with read port portion 1004 (shown in FIG. 10), the gate of the NMOS transistor R_PG1 of read port portion 1102b is configured to receive a tracking enable TE signal. In some embodiments, the gate of the NMOS transistor R_PG1 of read port portion 1102b is electrically connected to a tracking enable conductive line TE.

Memory cell 1104 is an embodiment of memory cell 1000 (shown in FIG. 10) with similar elements. As shown in FIG. 11, similar elements have a same reference number as shown in FIG. 10. Memory cell 1104 comprises a write port portion 1104a and a read portion 1104b.

Write port portion 1104a is an embodiment of write port portion 1002 with similar elements. In comparison with write port portion 1002 (shown in FIG. 10), write port portion 1104a is modified to include the features of memory cell 100D (as shown in FIG. 1D). In some embodiments, memory cell 1104 is a 2P SRAM read bit line capacitance tracking cell. In some embodiments, the bit line BL of the write port portion 1104a is floating. In some embodiments, the bit line bar BLB of the write port portion 1104a is a dummy bit line. In some embodiments, the bit line bar BLB of the write port portion 1104a is electrically floating.

Read port portion 1104b is an embodiment of read port portion 1004 with similar elements. In comparison with read port portion 1004 (shown in FIG. 10), read port portion 1104b is modified to form a 2P SRAM read bit line capacitance tracking cell. In comparison with read port portion 1004 (shown in FIG. 10), the gate of the NMOS transistor R_PG1 of read port portion 1104b is configured to receive a ground reference signal Vss. In some embodiments, the gate of the NMOS transistor R_PG1 of read port portion 1104b is electrically connected to ground reference conductor CVss. In some embodiments, both NMOS transistor R_PG1 and NMOS transistor R_PD1 of read port portion 1104b are configured in an off-state.

Figure 12A:
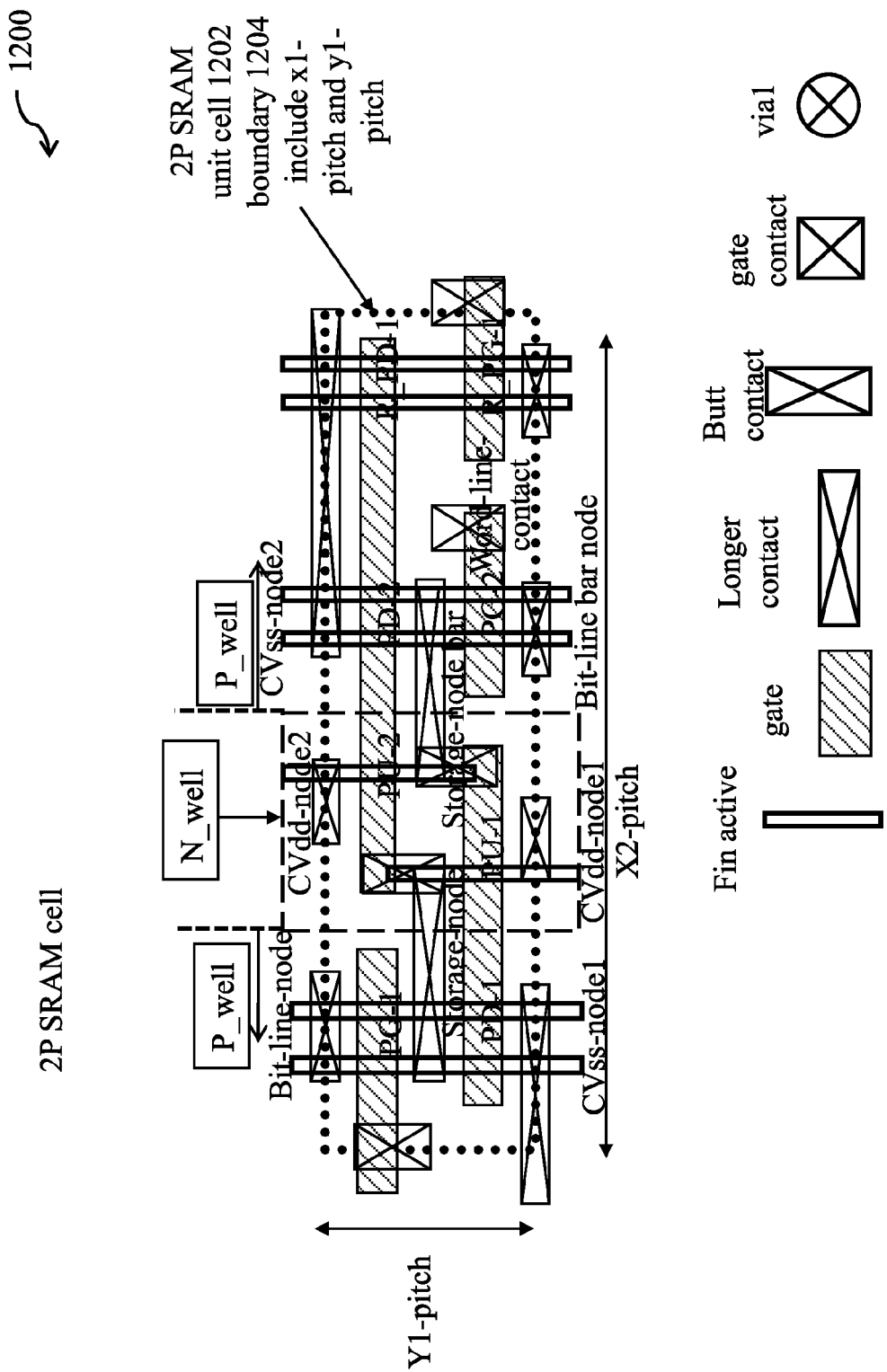
FIG. 12A is a portion of a layout diagram of the memory cell in FIG. 10 in accordance with one or more embodiments.

FIG. 12A is a portion of a layout diagram 1200 of the memory cell 1000 in FIG. 10 in accordance with one or more embodiments. The components of the layout diagram 1200 shown in FIG. 12A are the same or are similar to those depicted in FIGS. 1A-1B and FIG. 10 with the same reference number, and the detailed description thereof is omitted.

Layout diagram 1200 is an embodiment of layout diagram 500' (shown in FIG. 5B) with similar elements. As shown in FIG. 12A, similar elements have a same reference number as shown in FIG. 5B. Layout diagram 1200 is an embodiment of a hybrid multiple-fin/single fin 2P SRAM memory cell. For example, as shown in FIG. 12A, transistor devices PU-1 and PU-2 are single fin transistor devices, and transistor devices PD-1, PD-2, PG-1, PG-2, R_PD-1 and R_PG-1 are multiple-fin transistor devices.

Layout diagram 1200 includes an N-well region N_well, and P-Well regions P_Well1 and P_well-1. A cell boundary 1204 defines a unit cell 1202. Unit cell 1202 comprises transistor devices PU-1, PU-2, PD-1, PD-2, PG-1, PG-2, R_PD-1 and R_PG-1. In some embodiments, the unit cell 1202 is a 8 transistor (8T) configuration. In some embodiments, the shape of the unit cell 1202 is a rectangular cell shape. The unit cell 1202 comprises a first X-pitch X1 and a first Y-pitch Y1.

In some embodiments, transistor device R_PD-1 comprises at least two transistor devices connected in parallel, such that the source terminals for each transistor are connected together, the drain terminals for each transistor are connected together, and the gate terminals for each transistor are connected together.

In some embodiments, transistor device R_PG-1 comprises at least two transistor devices connected in parallel, such that the source terminals for each transistor are connected together, the drain terminals for each transistor are connected together, and the gate terminals for each transistor are connected together.

The PU transistors (e.g., PD-1 and PD-2) of layout 1200 shown in FIG. 12A comprises a first channel width (fin width-1), and a second channel width (fin width-2). In some embodiments, the first channel width (fin width-1) is wider than the second channel width (fin width-2) by at least 10%.

Figure 12B:
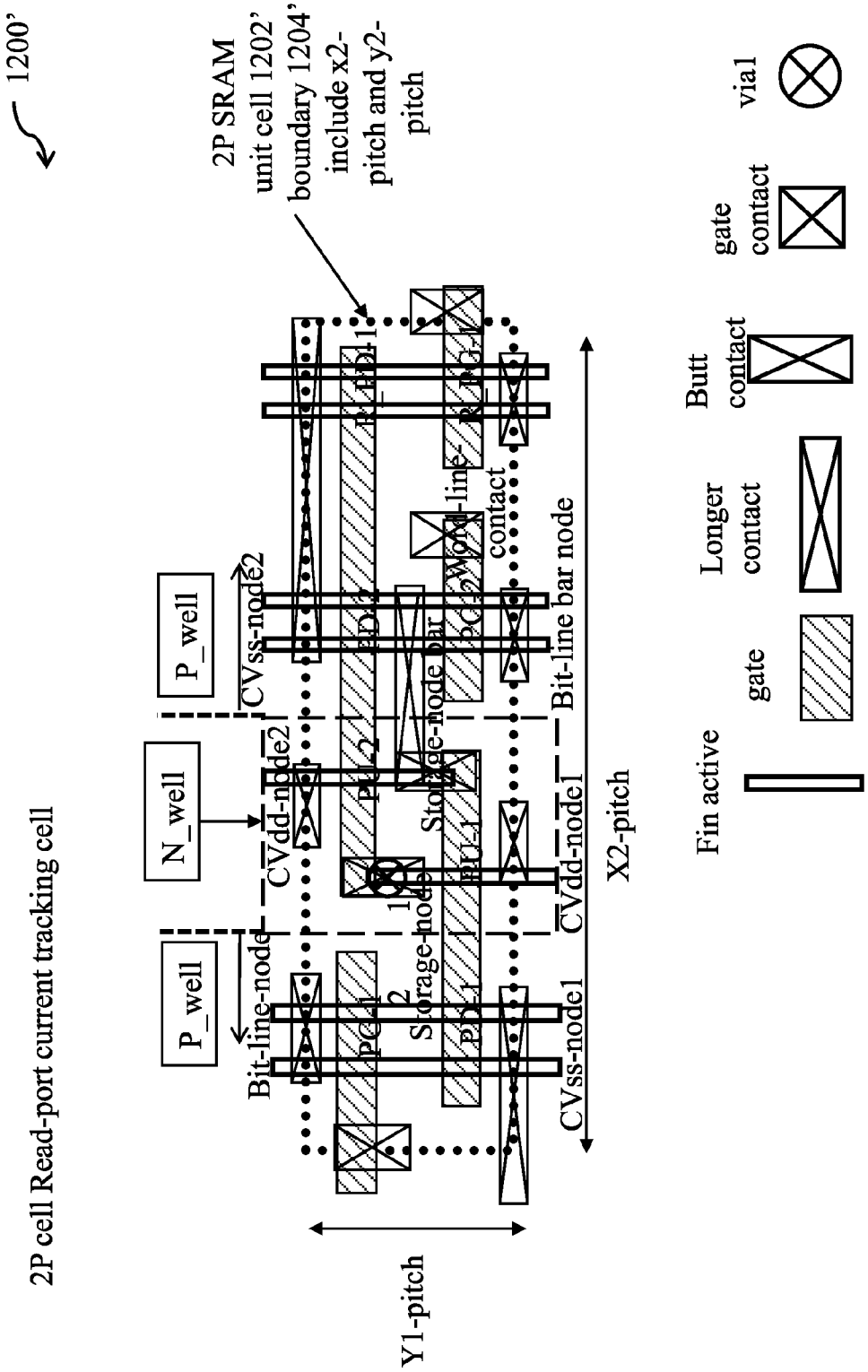
FIG. 12B is a portion of a layout diagram of the memory cell in FIG. 10 in accordance with one or more embodiments.

FIG. 12B is a portion of a layout diagram 1200' of the memory cell 1000 in FIG. 10 in accordance with one or more embodiments. The components of the layout diagram 1200' shown in FIG. 12B are the same or are similar to those depicted in FIGS. 1A-1B, FIG. 10 and FIG. 11 with the same reference number, and the detailed description thereof is omitted.

Layout diagram 1200' is an embodiment of layout diagram 1200 (shown in FIG. 12A) with similar elements. As shown in FIG. 12B, similar elements have a same reference number as shown in FIG. 12A. Layout diagram 1200' is an embodiment of a hybrid multiple-fin/single fin 2P SRAM memory cell. For example, as shown in FIG. 12B, transistor devices PU-1 and PU-2 are single fin transistor devices, and transistor devices PD-1, PD-2, PG-1, PG-2, R_PD-1 and R_PG-1 are multiple-fin transistor devices. In some embodiments, layout diagram 1200' is a portion of a layout diagram of a hybrid multiple-fin/single fin 2P SRAM read bit line current tracking cell. In some embodiments, layout diagram 1200' is a portion of a layout diagram of the memory cell 1102 shown in FIG. 11.

Figure 13A:
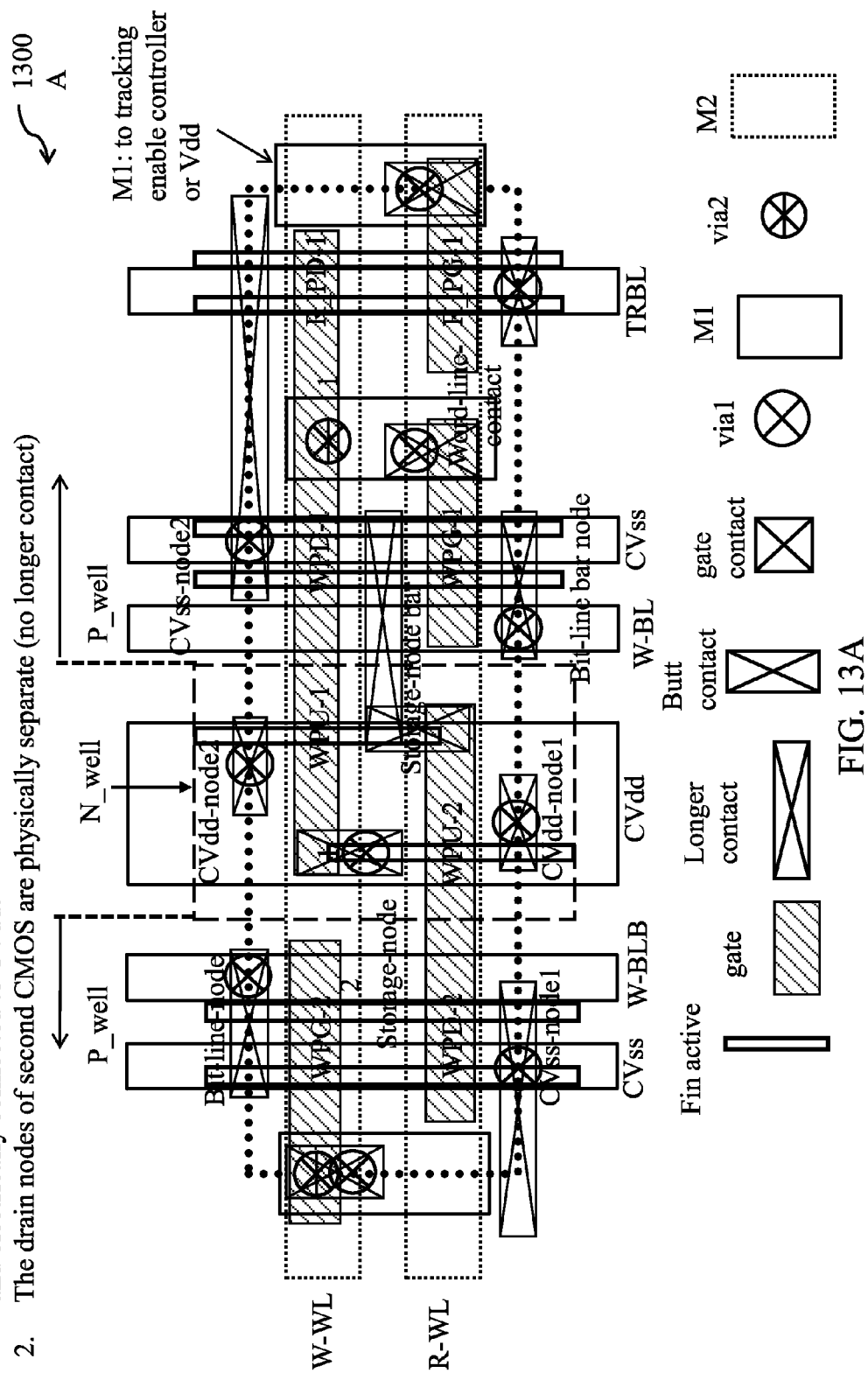
FIG. 13A is a portion of a layout diagram of the memory cell in FIG. 11 in accordance with one or more embodiments.

FIG. 13A is a portion of a layout diagram 1300A of the memory cell 1102 in FIG. 11 in accordance with one or more embodiments. The components of the layout diagram 1300A shown in FIG. 13A are the same or are similar to those depicted in FIGS. 1A-1B, FIG. 10 and FIG. 11 with the same reference number, and the detailed description thereof is omitted.

Layout diagram 1300A is an embodiment of layout diagram 1200' (shown in FIG. 12B) with similar elements. As shown in FIG. 13A, similar elements have a same reference number as shown in FIG. 12B. In some embodiments, layout diagram 1300A is a layout diagram of an SRAM current tracking cell (e.g., memory cell 1102). In some embodiments, layout diagram 1300A is a portion of a layout diagram of a hybrid multiple-fin/single fin 2P SRAM read bit line current tracking cell.

In comparison with the layout diagram 1200' (shown in FIG. 12B), layout diagram 1300A includes as plurality of first vias via1, metal layer M1, metal layer M2, and a plurality of second vias via2. The metal layer M0 includes the gate contact, the butt contact and the longer contact.

The gate of the NMOS transistor PD-1, the gate of the PMOS transistor PU-1 and the NMOS transistor R_PD1 are electrically connected to the source voltage reference conductor CVdd line by a gate contact 1 and a first via via1.

Metal layer M0 is located below metal layer M1. Metal layer M0 electrically connects the gate and drain of the current tracking cell to other metal layers (e.g., metal layer M1, metal layer M2, metal layer M3). Metal layer M0 comprises one or more local interconnects. The local interconnects comprise contacts (e.g., longer contact, butt contact and gate contact) of the current tracking cell of FIG. 13A.

Zero via via-0 electrically connects metal layer M0 to metal layer M1.

Metal layer M1 is located below metal layer M2. Metal layer M1 electrically connects metal layer M2 to metal layer M0 by first via via1.

Metal layer M2 is located below metal layer M3. Metal layer M2 electrically connects metal layer M3 to metal layer M1 by second via via2.

The source voltage reference conductor CVdd is located on metal layer M1. The tracking read bit line TRBL source voltage reference conductor CVdd is located on metal layer M1.

The ground reference conductor CVss is located on metal layer M1. The write word line W-WL conductor and the read word line conductor R-WL are located on metal layer M2.

A drain node of NMOS transistor PU-2 and a drain node of NMOS transistor PD-2 within layout diagram 1300A are electrically isolated.

Figure 13B:
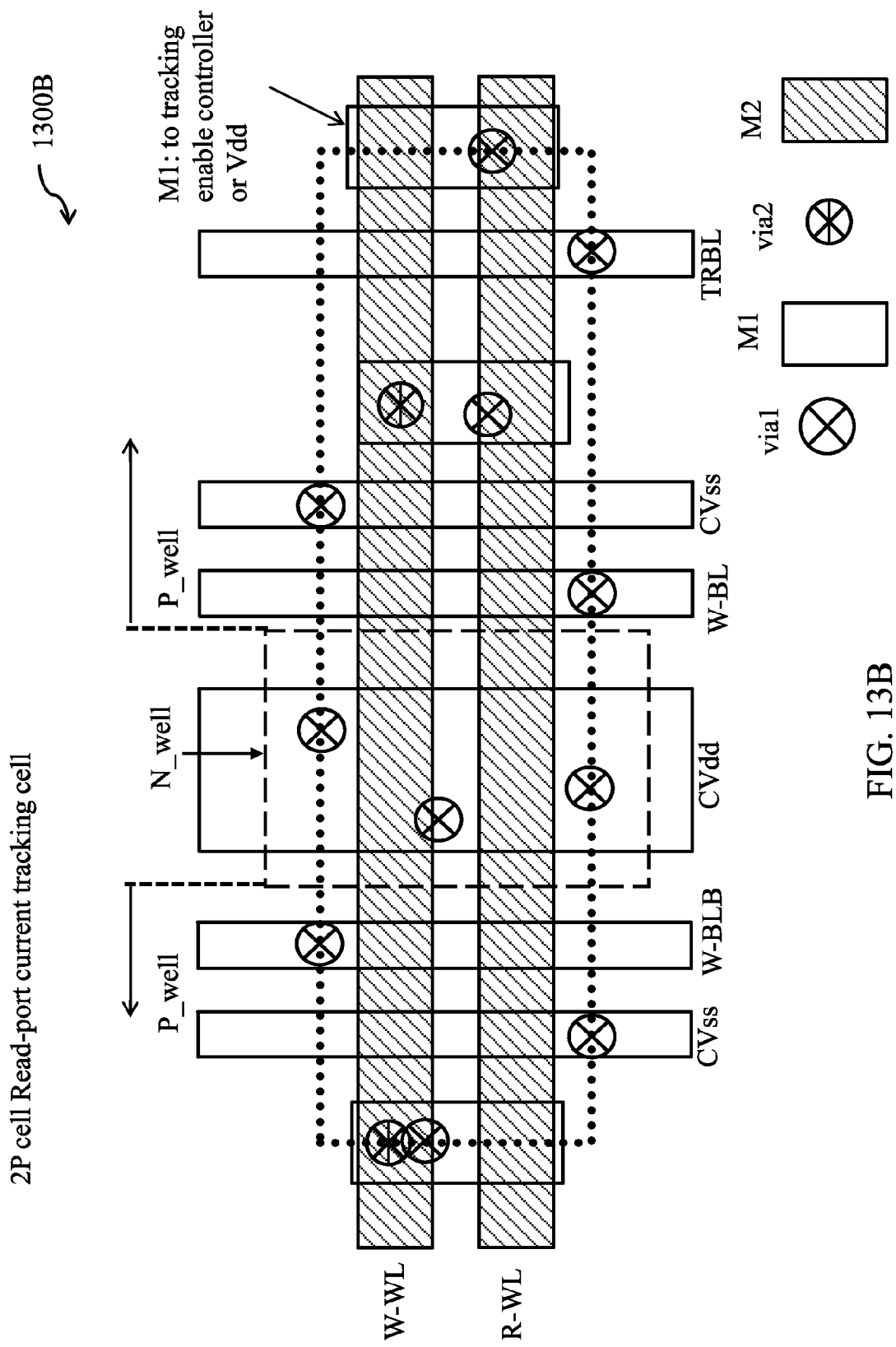
FIG. 13B is a portion of a layout diagram of the memory cell in FIG. 11 in accordance with one or more embodiments.

FIG. 13B is a portion of a layout diagram 1300B of the memory cell 1102 in FIG. 11 in accordance with one or more embodiments. The components of the layout diagram 1300B shown in FIG. 13B are the same or are similar to those depicted in FIGS. 1A-1B, FIG. 10 and FIG. 11 with the same reference number, and the detailed description thereof is omitted. Layout diagram 1300B is an embodiment of layout diagram 1300A (shown in FIG. 13A) with similar elements. As shown in FIG. 13B, similar elements have a same reference number as shown in FIG. 13A. In comparison with layout diagram 1300A (shown in FIG. 13A), layout diagram 1300B does not include the gates, the fin actives, the longer contacts, the butt contacts and the gate contacts (for illustrative purposes).

Figure 13C:
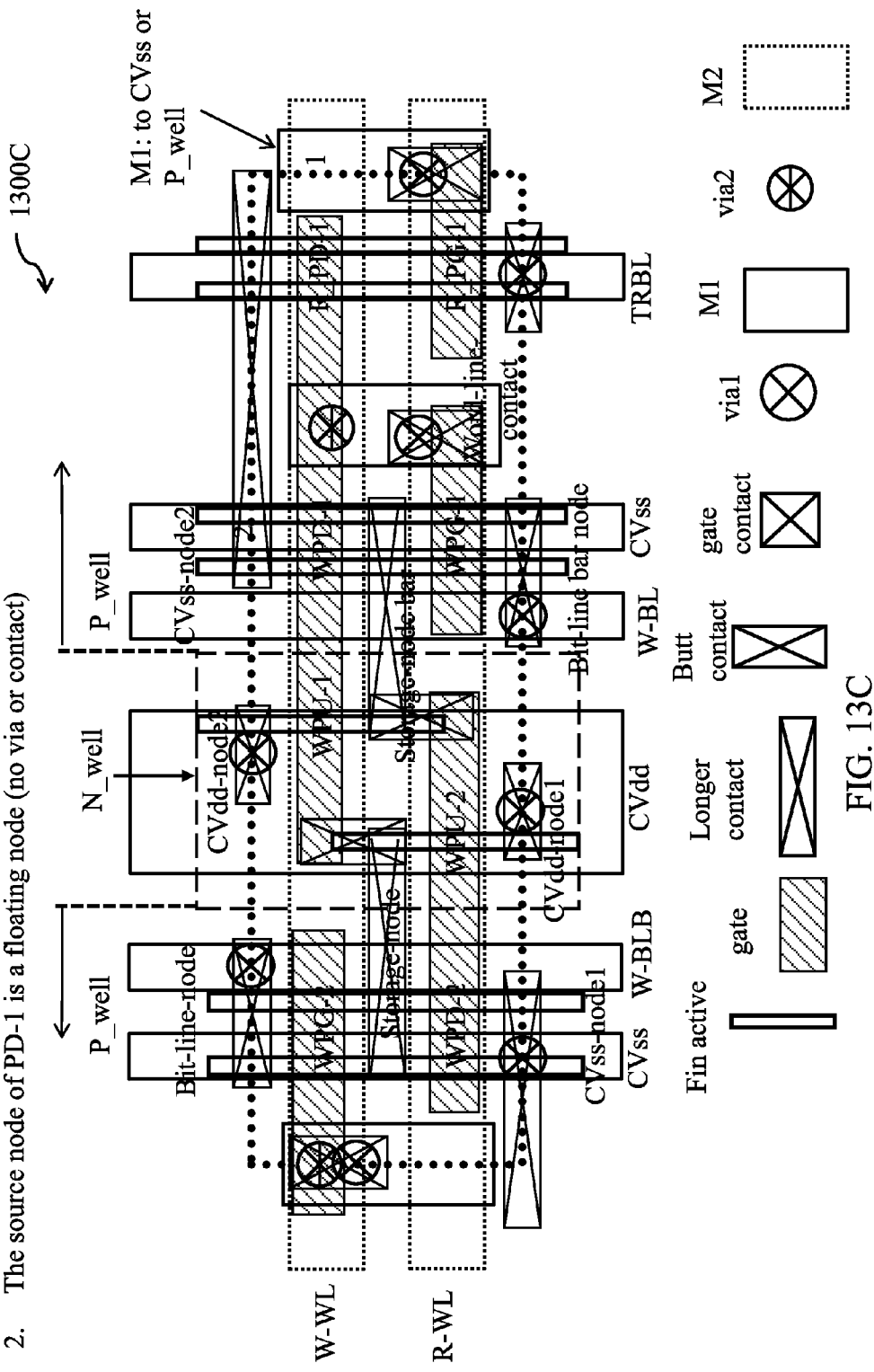
FIG. 13C is a portion of a layout diagram of the memory cell in FIG. 11 in accordance with one or more embodiments.

FIG. 13C is a portion of a layout diagram 1300C of the memory cell 1104 in FIG. 11 in accordance with one or more embodiments. The components of the layout diagram 1300C shown in FIG. 13C are the same or are similar to those depicted in FIGS. 1A-1B, FIG. 1D, FIG. 10 and FIG. 11 with the same reference number, and the detailed description thereof is omitted.

Layout diagram 1300C is an embodiment of layout diagram 1200' (shown in FIG. 12B) with similar elements. As shown in FIG. 13C, similar elements have a same reference number as shown in FIG. 12B. In some embodiments, layout diagram 1300C is a layout diagram of a 2P SRAM read bit line capacitance tracking cell (e.g., memory cell 1104). In some embodiments, layout diagram 1300C is a portion of a layout diagram of a hybrid multiple-fin/single fin 2P SRAM read bit line capacitance tracking cell.

In comparison with the layout diagram 1200' (shown in FIG. 12B), layout diagram 1300A includes as plurality of first vias via1, metal layer M1, metal layer M2, and a plurality of second vias via2. The metal layer M0 includes the gate contact, the butt contact and the longer contact.

The gate of the NMOS transistor R_PG1 is configured to receive to receive a ground reference signal Vss. In some embodiments, the gate of the NMOS transistor R_PG1 of read port portion 1104b is electrically connected to ground reference conductor CVss line by a gate contact 1 and a first via via1. In some embodiments, both NMOS transistor R_PG1 and NMOS transistor R_PD1 of read port portion 1104b are configured in an off-state.

Metal layer M0 is located below metal layer M1. Metal layer M0 electrically connects the gate and drain of the current tracking cell to other metal layers (e.g., metal layer M1, metal layer M2, metal layer M3). Metal layer M0 comprises one or more local interconnects. The local interconnects comprise contacts (e.g., longer contact, butt contact and gate contact) of the capacitance tracking cell of FIG. 13C.

Zero via via-0 electrically connects metal layer M0 to metal layer M1.

Metal layer M1 is located below metal layer M2. Metal layer M1 electrically connects metal layer M2 to metal layer M0 by first via via1.

Metal layer M2 is located below metal layer M3. Metal layer M2 electrically connects metal layer M3 to metal layer M1 by second via via2.

The source voltage reference conductor CVdd is located on metal layer M1. The tracking read bit line TRBL source voltage reference conductor CVdd is located on metal layer M1.

The ground reference conductor CVss is located on metal layer M1. The write word line W-WL conductor and the read word line conductor R-WL are located on metal layer M2.

A source node of NMOS transistor PD-1 within layout diagram 1300B is electrically floating.

Figure 13D:
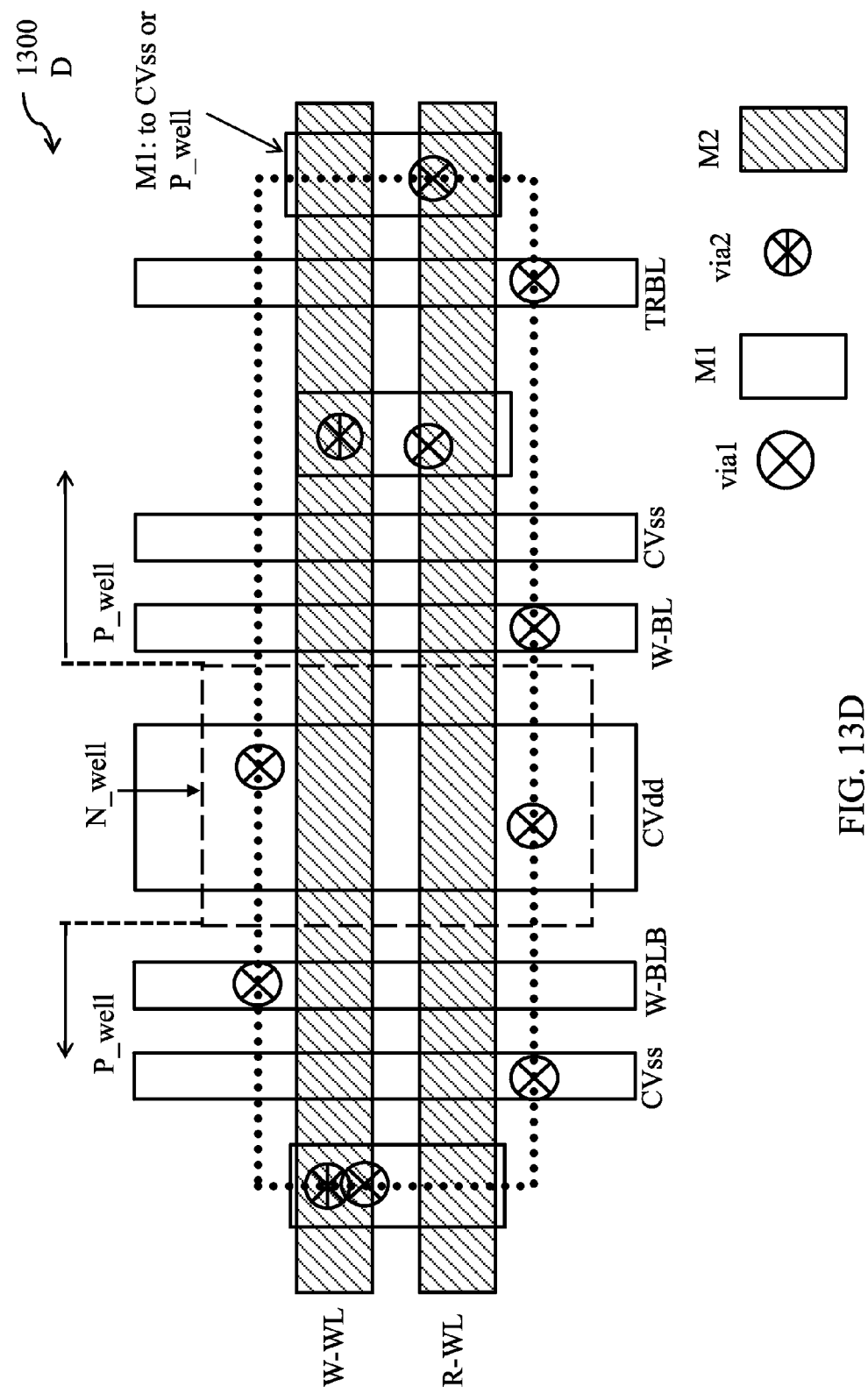
FIG. 13D is a portion of a layout diagram of the memory cell in FIG. 11 in accordance with one or more embodiments.

FIG. 13D is a portion of a layout diagram 1300D of the memory cell 1104 in FIG. 11 in accordance with one or more embodiments. The components of the layout diagram 1300D shown in FIG. 13D are the same or are similar to those depicted in FIGS. 1A-1B, FIG. 1D, FIG. 10 and FIG. 11 with the same reference number, and the detailed description thereof is omitted. Layout diagram 1300D is an embodiment of layout diagram 1300C (shown in FIG. 13C) with similar elements. As shown in FIG. 13D, similar elements have a same reference number as shown in FIG. 13C. In comparison with layout diagram 1300C (shown in FIG. 13C), layout diagram 1300D does not include the gates, the fin actives, the longer contacts, the butt contacts and the gate contacts (for illustrative purposes).

In some embodiments, the present disclosure provides alternative design solutions and process solutions for a fully-single fin FinFET SRAM memory cell. In some embodiments, the present disclosure provides a hybrid single fin FinFET SRAM memory cell/multiple-fin FinFET SRAM memory cell in a single SRAM memory chip which does not require read assist circuitry for all of the memory cells and is more cost effective than alternative configurations. In some embodiments, the present disclosure provides a co-optimized layout of multiple-cell types (e.g., hybrid single fin FinFET SRAM memory cell/multiple-fin FinFET SRAM memory cell in a single SRAM memory chip) utilized in a high volume manufacturing setting.

In some embodiments, the present disclosure describes a fully-single fin FinFET memory cell with a higher alpha ratio (e.g., Ion_PU/Ion_PG is substantially equal to 1). In some embodiments, write-assist circuitry or an extra Vt_PU tuning process are utilized to provide a good write margin for high alpha ratios (e.g., substantially equal to 1).

In some embodiments, the present disclosure describes a multiple-fin FinFET memory cell (e.g., multiple fins for the PG/PD devices and single fins for the PU devices) with a lower alpha ratio (e.g., Ion_PU/Ion_PG<=0.5). In some embodiments, a general operation of the memory cell is utilized for lower alpha ratios (e.g., <=0.5). In some embodiments, a general operation of the memory cell does not require the use of extra write-assist requirements, and standard processes are utilized to manufacture the memory cells which results in lower costs.

One aspect of this description relates to a synchronous random access memory (SRAM) chip, comprising a plurality of SRAM cells and a plurality of cell current tracking cells. Each of the SRAM cells comprise a source voltage reference conductor; a first ground reference conductor; two cross-coupled inverters, and two pass-gate devices. Each cell current tracking cell comprises a first half-cell, wherein the first half-cell comprises a first tracking bit-line conductor; a first complementary metal oxide semiconductor (CMOS) comprising: a first pull down (PD) device, and a first pull up (PU) device, and a first pass-gate device configured to track a current; and a second half-cell, wherein the second half-cell comprises: a second CMOS comprising: a second PD device, and a second PU device, and a second pass-gate device configured to control a data type; wherein the first half-cell is different from the second half-cell; wherein a gate of the first CMOS is electrically connected to the source voltage reference conductor; wherein a drain node of the second PU device is electrically isolated from a drain node of the second PD device; wherein a gate node of the first pass-gate device is electrically connected to a tracking enable conductor; and wherein a gate node of the second pass-gate device is electrically connected to a first word-line conductor.

Still another aspect of this description relates to an synchronous random access memory (SRAM) chip, comprising a plurality of SRAM cells; a plurality of tracking cells; a plurality of first edge cells; a plurality of second edge cells, and a plurality of well strapping cells; wherein each of the SRAM cells comprises a source voltage reference conductor; a first ground reference conductor; two cross-couple inverters, and two pass-gate devices; wherein each of the tracking cells comprise: a first half-cell, wherein the first half-cell comprises: a first tracking bit-line conductor; a first CMOS comprising a first pull down (PD) device, and a first pull up (PU) device, and a first pass-gate device configured to track a current; and a second half-cell, wherein the second half-cell comprises a second CMOS comprising a second PD device, and a second PU device, and a second pass-gate device; wherein the first half-cell is different than the second half-cell; wherein a gate node of the first pass-gate device is electrically connected to a tracking enable conductor; wherein a gate node of the second pass-gate device is electrically connected to a first predetermined word-line conductor; wherein each of the SRAM cells and each of the tracking cells are located in a memory cell array; wherein the SRAM cells are arranged by a plurality of columns and a plurality of rows; wherein each of the tracking cells are arranged in a first column; wherein the first column is adjacent to an edge column of the SRAM cells; a plurality of first edge cells, wherein the plurality of first edge cells are arranged in a second column, and are adjacent to the first column; a plurality of second edge cells, wherein the plurality of second edge cells are arranged in a second column, and are adjacent to the plurality of columns of the SRAM cells; wherein the first edge cell comprises the tracking enable conductor; and wherein a cell size of each of the SRAM cells and a cell size of each of the tracking cells are substantially the same.

Yet another aspect of this description relates to two port (2P) static random access memory (SRAM) array comprising a plurality of 2P SRAM cells configured to store data, and a plurality of tracking cells configured to track each of the cells; wherein each of the 2P SRAM cells comprise a write port, and a read-port; wherein the write-port comprises two cross-coupled inverters having a data storage node, and a complementary data bar storage node; wherein each inverter comprises one write pull down (PD) device, and one write pull up (PU) device a first write pass gate device, and a second write pass gate device; wherein the read-port comprises a read pull down device, and a read pass gate device, wherein the read pull down device, and the read pass gate device are cascaded; wherein each of the tracking cells comprise a first type tracking cell, and a second type tracking cell; wherein each of the first type tracking cell comprises a first tracking write-port, and a first tracking read-port; wherein the first tracking read-port comprises a first tracking read bit-line conductor; a first tracking read PD device, and a first tracking read PG device; wherein the first tracking write-port comprises a first half-cell, and a second half-cell; wherein the first half-cell comprises a first tracking write bit-line conductor; a first CMOS, and a first pass-gate device; wherein the second half-cell comprises a second pass-gate device; a second PD device, and a second PU device; wherein a gate node of the first CMOS and a gate of the first tracking read PD device are both electrically connected to a source voltage reference conductor; a drain node of the second PD device and a drain node of the second PU device are both electrically isolated; a gate node of the first tracking read PG gate device is electrically connected to a tracking enable conductor; wherein each of the second type tracking cell comprises a second tracking write-port, and a second tracking read-port; wherein the second tracking read-port comprises a first tracking read bit-line conductor; a second tracking read PD device, and a second tracking read PG device; wherein the second tracking write-port comprises a third half-cell, and a fourth half-cell; wherein the third half-cell comprises a first tracking write bit-line conductor; a second CMOS, and a third pass-device; wherein the fourth half-cell comprises a third CMOS, and a fourth pass-device configured as a dummy device; wherein the second CMOS comprises a third PU device, and a third PD device; wherein a source node of the third PD device is electrically floating; wherein the third CMOS comprises a fourth PU device, and a fourth PD device; wherein a source node of the fourth PD device is electrically connected to a first ground reference conductor; wherein a gate node of the second read-PG device is electrically connected to at least the first ground reference conductor or a P_well conductor; and wherein a gate node of the second CMOS and a gate of the second tracking PD device are electrically connected.

The foregoing outlines features of several embodiments so that those of ordinary skill in the art may better understand the aspects of the present disclosure. Those of ordinary skill in the art should appreciate that they may readily use the present disclosure as a basis for designing or modifying other circuits, processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A static random access memory (SRAM) chip comprising:
   a plurality of SRAM cells, wherein each of the plurality of SRAM cells comprise:
      a source voltage reference conductor;

a first ground reference conductor;
two cross-coupled inverters, and
two pass-gate devices; and
a plurality of cell current tracking cells, wherein each of the plurality of cell current tracking cells comprises:
a first half-cell, wherein the first half-cell comprises:
a first tracking bit-line conductor;
a first complementary metal oxide semiconductor (CMOS) comprising:
a first pull down (PD) device, and
a first pull up (PU) device, and
a first pass-gate device configured to track a current; and
a second half-cell, wherein the second half-cell comprises:
a second CMOS comprising:
a second PD device, and
a second PU device, and
a second pass-gate device configured to receive a word line signal;
a plurality of capacitance tracking cells, wherein each of the capacitance tracking cells of the plurality of capacitance tracking cells comprise:
a third half-cell comprising:
a third pass-gate device configured to track a bit-line capacitance, and
a third CMOS comprising:
a third PU device, and
a third PD device having a source node configured to be electrically floating;
wherein the first half-cell is different from the second half-cell;
wherein a gate of the first PD device of the first CMOS or a gate of the first PU device of the first CMOS is electrically connected to the source voltage reference conductor;
wherein a drain node of the second PU device is electrically isolated from a drain node of the second PD device;
wherein a gate node of the first pass-gate device is electrically connected to a tracking enable conductor; and
wherein a gate node of the second pass-gate device is electrically connected to a first word-line conductor.

2. The SRAM chip of claim 1, wherein each of the capacitance tracking cells of the plurality of capacitance tracking cells further comprise:
a fourth half-cell, wherein the fourth half-cell comprises:
a fourth CMOS, and
a fourth pass-gate device configured as a dummy cell;
wherein the third half-cell is different from the fourth half-cell;
wherein the fourth CMOS comprises:
a fourth PU device, and
a fourth PD device, wherein a source node of the fourth PD device is electrically connected to a second ground reference conductor;
wherein a gate node of the third pass-gate device is electrically connected to the second ground reference conductor; and
wherein a gate node of the fourth pass-gate device is electrically connected to the first word-line conductor.

3. The SRAM chip of claim 2, wherein the second ground reference conductor is electrically connected to the first ground reference conductor.

4. The SRAM chip of claim 2, wherein the second ground reference conductor is electrically connected to a P_well conductor of a cell current tracking cell of the plurality of cell current tracking cells.

5. The SRAM chip of claim 1, wherein a connection path from the gate of the first PD device of the first CMOS or a gate of the first PU device of the first CMOS to the source voltage reference conductor comprises:
a gate contact, and
a first via.

6. The SRAM chip of claim 2, wherein a source node of the fourth PU device is electrically floating.

7. The SRAM chip of claim 1, wherein a cell size of each of the plurality of SRAM cells and a cell size of each of the tracking cells of the plurality of cell current tracking cells or the plurality of capacitance tracking cells are substantially the same.

8. The SRAM chip of claim 1, further comprising a memory cell array,
wherein the memory cell array is arranged by a plurality of columns and a plurality of rows;
wherein the plurality of SRAM cells and the tracking cells of the plurality of cell current tracking cells or the plurality of capacitance tracking cells are both located in the memory cell array; and
wherein the tracking cells of the plurality of cell current tracking cells or the plurality of capacitance tracking cells are located adjacent to an edge column of the plurality of SRAM cells.

9. The SRAM chip of claim 2, wherein each of the plurality of cell current tracking cells and each of the plurality of capacitance tracking cells are located in a first column;
wherein the first column comprises at least 2 to 32 cell current tracking cells;
wherein a drain node of the first pass-gate device and a drain node of the third pass-gate device are each electrically connected to the first tracking bit-line conductor.

10. The SRAM chip of claim 9, further comprising:
a plurality of edge cells, wherein the plurality of edge cells are arranged in a second column, and are adjacent to the first column;
wherein a portion of the plurality of edge cells comprise:
a first edge cell, and
a second edge cell, wherein the first edge cell comprises the tracking enable conductor which is electrically connected to a gate node of each of the plurality of cell current tracking cells in the first column.

11. A static random access memory (SRAM) chip comprises:
a plurality of SRAM cells;
a plurality of tracking cells;
a plurality of first edge cells;
a plurality of second edge cells, and
a plurality of well strap cells;
wherein each of the plurality of SRAM cells comprises:
a source voltage reference conductor;
a first ground reference conductor;
two cross-coupled inverters, and
two pass-gate devices;
wherein each of the plurality of tracking cells comprise:
a first half-cell, wherein the first half-cell comprises:
a first tracking bit-line conductor;
a first complementary metal oxide semiconductor (CMOS) comprising:
a first pull down (PD) device, and a first pull up (PU) device, and
a first pass-gate device configured to track a current; and
a second half-cell, wherein the second half-cell comprises:
a second CMOS comprising:
a second PD device, and
a second PU device, and
a second pass-gate device;
wherein the first half-cell is different than the second half-cell;
wherein a gate node of the first pass-gate device is electrically connected to a tracking enable conductor;
wherein a gate node of the second pass-gate device is electrically connected to a first predetermined word-line conductor;
wherein each of the plurality of SRAM cells and each of the plurality of tracking cells are located in a memory cell array;
wherein the plurality of SRAM cells are arranged by a plurality of columns and a plurality of rows;
wherein each of the plurality of tracking cells are arranged in a first column;
wherein the first column is adjacent to an edge column of the plurality of SRAM cells;
a plurality of first edge cells, wherein the plurality of first edge cells are arranged in a second column, and are adjacent to the first column;
a plurality of second edge cells, wherein the plurality of second edge cells are arranged in a third column, and are adjacent to the plurality of columns of the plurality of SRAM cells;
wherein the plurality of first edge cells comprise the tracking enable conductor; and
wherein a cell size of each of the plurality of SRAM cells and a cell size of each of the plurality of tracking cells are substantially the same.

12. The SRAM chip of claim 11, wherein the plurality of well strap cells are arranged in a first row and a second row, wherein the first row and the second row are located at opposing ends of the plurality of SRAM cells;
wherein each well strap cell of the plurality of well strap cells comprises:
a P-well strap conductor line, and
an N-Well strap conductor line;
wherein the tracking enable conductor is electrically connected to the P-well strap conductor line of at least a well strap cell of the plurality of well strap cells.

13. The SRAM chip of claim 11, wherein the first ground reference conductor physically extends to the plurality of first edge cells; and wherein the tracking enable conductor is electrically connected to the first ground reference conductor.

14. The SRAM chip of claim 11, wherein a gate of the first PD device or the first PU device of the first CMOS is electrically connected to the source voltage reference conductor; and wherein a drain node of the second PD device or the second PU device of the second CMOS is electrically isolated.

15. The SRAM chip of claim 11, further comprising a plurality of capacitance tracking cells, wherein each of the plurality of capacitance tracking cells comprise:
a third half-cell, wherein the third half-cell comprises:
the first tracking bit-line conductor;
a third CMOS, and
a third pass-gate device configured to track a bit-line capacitance;
a fourth half-cell, wherein the fourth half-cell comprises:
a fourth CMOS, and
a fourth pass-gate device configured as a dummy cell;
wherein the third half-cell is different from the fourth half-cell;
wherein the third CMOS comprises:
a third PU device, and
a third PD device; wherein a source node of the third PD device is electrically floating;
wherein the fourth CMOS comprises:
a fourth PU device, and
a fourth PD device, wherein a source node of the fourth PD device is electrically connected to the first ground reference conductor;
wherein a gate node of the third pass-gate device is electrically connected to the first ground reference conductor;
wherein a gate node of the fourth pass-gate device is electrically connected to the first predetermined word-line conductor; and
wherein each of the plurality of capacitance tracking cells are located in the first column.

16. A two port (2P) static random access memory (SRAM) array comprising:
a plurality of 2P SRAM cells configured to store data, and
a plurality of tracking cells configured to track each of the plurality of 2P SRAM cells;
wherein each of the plurality of 2P SRAM cells comprise:
a write port, and
a read-port;
wherein the write-port comprises:
two cross-coupled inverters having a data storage node, and a complementary data bar storage node;
wherein each of the cross-coupled inverters comprise:
one write pull down (PD) device, and
one write pull up (PU) device
a first write pass gate (PG) device, and
a second write pass gate device;
wherein the read-port comprises:
a read pull down device, and
a read pass gate device, wherein the read pull down device, and the read pass gate device are cascaded;
wherein each of the plurality of tracking cells comprise:
a first type tracking cell, and
a second type tracking cell;
wherein each of the first type tracking cells comprise:
a first tracking write-port, and
a first tracking read-port;
wherein the first tracking read-port comprises:
a first tracking read bit-line conductor;
a first tracking read PD device, and
a first tracking read PG device;
wherein the first tracking write-port comprises:
a first half-cell, and
a second half-cell;
wherein the first half-cell comprises:
a first tracking write bit-line conductor;
a first complementary metal oxide semiconductor (CMOS), and
a first pass-gate device;
wherein the second half-cell comprises:
a second pass-gate device;
a second PD device, and
a second PU device;

wherein a gate node of the first CMOS and a gate of the first tracking read PD device are both electrically connected to a source voltage reference conductor;
a drain node of the second PD device and a drain node of the second PU device are both electrically isolated;
a gate node of the first tracking read PG gate device is electrically connected to a tracking enable conductor;
wherein each of the second type tracking cells comprise:
a second tracking write-port, and
a second tracking read-port;
wherein the second tracking read-port comprises:
a first tracking read bit-line conductor;
a second tracking read PD device, and
a second tracking read PG device;
wherein the second tracking write-port comprises:
a third half-cell, and
a fourth half-cell;
wherein the third half-cell comprises:
a first tracking write bit-line conductor;
a second CMOS, and
a third pass-gate device;
wherein the fourth half-cell comprises:
a third CMOS, and
a fourth pass-gate device configured as a dummy device;
wherein the second CMOS comprises:
a third PU device, and
a third PD device;
wherein a source node of the third PD device is electrically floating;
wherein the third CMOS comprises:
a fourth PU device, and
a fourth PD device;
wherein a source node of the fourth PD device is electrically connected to a first ground reference conductor;
wherein a gate node of the second tracking read PG device is electrically connected to at least the first ground reference conductor or a P_well conductor; and
wherein a gate node of the second CMOS and a gate of the second tracking read PD device are electrically connected.

17. The 2P SRAM array of claim 16, wherein a connection path from the gate node of the first CMOS to the source voltage reference conductor comprises:
a gate contact, and
a first via.

18. The 2P SRAM array of claim 17, wherein a cell size of each of the plurality of 2P SRAM cells and a cell size of each of the plurality of tracking cells are substantially the same.

19. The 2P SRAM array of claim 17, wherein each of the plurality of tracking cells are located in a first column;
wherein the first column comprises at least 2 to 32 tracking cells;
a drain node of the first pass-gate device and a drain node of the third pass-gate device are each electrically connected to the first tracking read bit-line conductor.

20. The 2P SRAM array of claim 19, further comprising:
a plurality of edge cells, wherein the plurality of edge cells are arranged in a second column, and are adjacent to the first column;
wherein a portion of the plurality of edge cells comprise:
a first edge cell, and
a second edge cell, wherein the first edge cell comprises the tracking enable conductor which is electrically connected to a gate node of each of the plurality of tracking cells in the first column.

* * * * *